(12) United States Patent
Shokrollahi et al.

(10) Patent No.: US 9,240,810 B2
(45) Date of Patent: *Jan. 19, 2016

(54) SYSTEMS AND PROCESSES FOR DECODING CHAIN REACTION CODES THROUGH INACTIVATION

(75) Inventors: Amin Shokrollahi, Preverenges (CH); Soren Lassen, Glebe (AU); Richard Karp, Berkeley, CA (US)

(73) Assignee: Digital Fountain, Inc., San Diego, CA (US)

(*) Notice: Subject to any disclaimer, the term of this patent is extended or adjusted under 35 U.S.C. 154(b) by 743 days.

This patent is subject to a terminal disclaimer.

(21) Appl. No.: 12/549,560

(22) Filed: Aug. 28, 2009

(65) Prior Publication Data

US 2011/0103519 A1 May 5, 2011

Related U.S. Application Data

(63) Continuation-in-part of application No. 11/842,102, filed on Aug. 20, 2007, now Pat. No. 7,633,413, which is a continuation of application No. 11/356,303, filed on Feb. 15, 2006, now Pat. No. 7,265,688, which is a (Continued)

(51) Int. Cl.
| | |
|---|---|
| *H03M 5/00* | (2006.01) |
| *H03M 13/37* | (2006.01) |
| *H03M 13/11* | (2006.01) |
| *H03M 13/19* | (2006.01) |

(52) U.S. Cl.
CPC ...... *H03M 13/3761* (2013.01); *H03M 13/1102* (2013.01); *H03M 13/19* (2013.01)

(58) Field of Classification Search
USPC ......... 341/50–52, 94; 714/746, 751, 752, 786
See application file for complete search history.

(56) References Cited

U.S. PATENT DOCUMENTS

| | | | |
|---|---|---|---|
| 3,909,721 A | 9/1975 | Bussgang et al. | |
| 4,365,338 A | 12/1982 | McRae et al. | |
| 4,589,112 A | 5/1986 | Karim | |
| 4,901,319 A | 2/1990 | Ross | |

(Continued)

FOREIGN PATENT DOCUMENTS

| | | |
|---|---|---|
| CN | 1338839 A | 3/2002 |
| CN | 1425228 A | 6/2003 |

(Continued)

OTHER PUBLICATIONS

3GPP TS 26.234 V9.1.0, "3rd Generation Partnership Project; Technical Specification Group Services and System Aspects; Transparent end-to-end Packet-switched Streaming Service (PSS); Protocols and codecs (Release 9)", Dec. 2009, p. 179.

(Continued)

*Primary Examiner* — Linh Nguyen

(57) ABSTRACT

A method for processing a chain reaction code includes first selecting a source symbol which is associated with an output symbol of degree two or higher (i.e., an output symbol which is itself associated with two or more input symbols), and subsequently deactivating the selected source symbol in an attempt to produce an output symbol of degree one. The inactivation process can be repeated either successively until an output symbol of degree one is identified, and/or whenever the decoding process is unable to locate an output symbol of degree one.

36 Claims, 12 Drawing Sheets

Related U.S. Application Data continuation of application No. 11/031,331, filed on Jan. 7, 2005, now Pat. No. 7,030,785, which is a continuation of application No. 10/459,370, filed on Jun. 10, 2003, now Pat. No. 6,856,263.

(60) Provisional application No. 60/388,129, filed on Jun. 11, 2002, provisional application No. 61/235,285, filed on Aug. 19, 2009.

(56) References Cited

U.S. PATENT DOCUMENTS

| | | |
|---|---|---|
| 5,136,592 A | 8/1992 | Weng |
| 5,153,591 A | 10/1992 | Clark |
| 5,329,369 A | 7/1994 | Willis et al. |
| 5,331,320 A | 7/1994 | Cideciyan et al. |
| 5,371,532 A | 12/1994 | Gelman et al. |
| 5,372,532 A | 12/1994 | Robertson, Jr. |
| 5,379,297 A | 1/1995 | Glover et al. |
| 5,421,031 A | 5/1995 | De Bey |
| 5,425,050 A | 6/1995 | Schreiber et al. |
| 5,432,787 A | 7/1995 | Chethik |
| 5,455,823 A | 10/1995 | Noreen et al. |
| 5,465,318 A | 11/1995 | Sejnoha |
| 5,517,508 A | 5/1996 | Scott |
| 5,524,025 A | 6/1996 | Lawrence et al. |
| 5,566,208 A | 10/1996 | Balakrishnan |
| 5,568,614 A | 10/1996 | Mendelson et al. |
| 5,583,784 A | 12/1996 | Kapust et al. |
| 5,608,738 A | 3/1997 | Matsushita |
| 5,617,541 A | 4/1997 | Albanese et al. |
| 5,642,365 A | 6/1997 | Murakami et al. |
| 5,659,614 A | 8/1997 | Bailey, III |
| 5,699,473 A | 12/1997 | Kim |
| 5,701,582 A | 12/1997 | Debey |
| 5,751,336 A | 5/1998 | Aggarwal et al. |
| 5,754,563 A | 5/1998 | White |
| 5,757,415 A | 5/1998 | Asamizuya et al. |
| 5,802,394 A | 9/1998 | Baird et al. |
| 5,805,825 A | 9/1998 | Danneels et al. |
| 5,835,165 A | 11/1998 | Keate et al. |
| 5,844,636 A | 12/1998 | Joseph et al. |
| 5,852,565 A | 12/1998 | Demos |
| 5,870,412 A | 2/1999 | Schuster et al. |
| 5,903,775 A | 5/1999 | Murray |
| 5,917,852 A | 6/1999 | Butterfield et al. |
| 5,926,205 A | 7/1999 | Krause et al. |
| 5,933,056 A | 8/1999 | Rothenberg |
| 5,936,659 A | 8/1999 | Viswanathan et al. |
| 5,936,949 A | 8/1999 | Pasternak et al. |
| 5,953,537 A | 9/1999 | Balicki et al. |
| 5,970,098 A | 10/1999 | Herzberg |
| 5,983,383 A | 11/1999 | Wolf |
| 5,993,056 A | 11/1999 | Vaman et al. |
| 6,005,477 A | 12/1999 | Deck et al. |
| 6,011,590 A | 1/2000 | Saukkonen |
| 6,012,159 A | 1/2000 | Fischer et al. |
| 6,014,706 A | 1/2000 | Cannon et al. |
| 6,018,359 A | 1/2000 | Kermode et al. |
| 6,041,001 A | 3/2000 | Estakhri |
| 6,044,485 A | 3/2000 | Dent et al. |
| 6,061,820 A | 5/2000 | Nakakita et al. |
| 6,073,250 A | 6/2000 | Luby et al. |
| 6,079,041 A | 6/2000 | Kunisa et al. |
| 6,079,042 A | 6/2000 | Vaman et al. |
| 6,081,907 A | 6/2000 | Witty et al. |
| 6,081,909 A | 6/2000 | Luby et al. |
| 6,081,918 A | 6/2000 | Spielman |
| 6,088,330 A | 7/2000 | Bruck et al. |
| 6,097,320 A | 8/2000 | Kuki et al. |
| 6,134,596 A | 10/2000 | Bolosky et al. |
| 6,141,053 A | 10/2000 | Saukkonen |
| 6,141,787 A | 10/2000 | Kunisa et al. |
| 6,141,788 A | 10/2000 | Rosenberg et al. |
| 6,154,452 A | 11/2000 | Marko et al. |
| 6,163,870 A | 12/2000 | Luby et al. |
| 6,166,544 A | 12/2000 | Debbins et al. |
| 6,175,944 B1 | 1/2001 | Urbanke et al. |
| 6,178,536 B1 | 1/2001 | Sorkin |
| 6,185,265 B1 | 2/2001 | Campanella |
| 6,195,777 B1 | 2/2001 | Luby et al. |
| 6,223,324 B1 | 4/2001 | Sinha et al. |
| 6,226,259 B1 | 5/2001 | Piret |
| 6,226,301 B1 | 5/2001 | Cheng et al. |
| 6,229,824 B1 | 5/2001 | Marko |
| 6,243,846 B1 | 6/2001 | Schuster et al. |
| 6,272,658 B1 | 8/2001 | Steele et al. |
| 6,278,716 B1 | 8/2001 | Rubenstein et al. |
| 6,298,462 B1 | 10/2001 | Yi |
| 6,307,487 B1 | 10/2001 | Luby |
| 6,314,289 B1 | 11/2001 | Eberlein et al. |
| 6,320,520 B1 | 11/2001 | Luby |
| 6,332,163 B1 | 12/2001 | Bowman-Amuah |
| 6,333,926 B1 | 12/2001 | Van Heeswyk et al. |
| 6,373,406 B2 | 4/2002 | Luby |
| 6,393,065 B1 | 5/2002 | Piret et al. |
| 6,411,223 B1 | 6/2002 | Haken et al. |
| 6,415,326 B1 | 7/2002 | Gupta et al. |
| 6,420,982 B1 | 7/2002 | Brown |
| 6,421,387 B1 | 7/2002 | Rhee |
| 6,430,233 B1 | 8/2002 | Dillon et al. |
| 6,445,717 B1 | 9/2002 | Gibson et al. |
| 6,459,811 B1 | 10/2002 | Hurst, Jr. |
| 6,466,698 B1 | 10/2002 | Creusere |
| 6,473,010 B1 | 10/2002 | Vityaev et al. |
| 6,486,803 B1 | 11/2002 | Luby et al. |
| 6,487,692 B1 | 11/2002 | Morelos-Zaragoza |
| 6,496,980 B1 | 12/2002 | Tillman et al. |
| 6,497,479 B1 | 12/2002 | Stoffel et al. |
| 6,510,177 B1 | 1/2003 | De et al. |
| 6,523,147 B1 | 2/2003 | Kroeger et al. |
| 6,535,920 B1 | 3/2003 | Parry et al. |
| 6,577,599 B1 | 6/2003 | Gupta et al. |
| 6,584,543 B2 | 6/2003 | Williams et al. |
| 6,609,223 B1 | 8/2003 | Wolfgang |
| 6,614,366 B2 | 9/2003 | Luby |
| 6,618,451 B1 | 9/2003 | Gonikberg |
| 6,631,172 B1 | 10/2003 | Shokrollahi et al. |
| 6,633,856 B2 * | 10/2003 | Richardson et al. ............ 706/15 |
| 6,641,366 B2 | 11/2003 | Nordhoff |
| 6,643,332 B1 | 11/2003 | Morelos-Zaragoza et al. |
| 6,677,864 B2 | 1/2004 | Khayrallah |
| 6,678,855 B1 | 1/2004 | Gemmell |
| 6,694,476 B1 | 2/2004 | Sridharan et al. |
| 6,704,370 B1 | 3/2004 | Chheda et al. |
| 6,732,325 B1 | 5/2004 | Tash et al. |
| 6,742,154 B1 | 5/2004 | Barnard |
| 6,748,441 B1 * | 6/2004 | Gemmell ...................... 709/231 |
| 6,751,772 B1 | 6/2004 | Kim et al. |
| 6,765,866 B1 | 7/2004 | Wyatt |
| 6,804,202 B1 | 10/2004 | Hwang |
| 6,810,499 B2 | 10/2004 | Sridharan et al. |
| 6,820,221 B2 * | 11/2004 | Fleming .......................... 714/31 |
| 6,831,172 B1 | 12/2004 | Barbucci et al. |
| 6,849,803 B1 | 2/2005 | Gretz |
| 6,850,736 B2 | 2/2005 | McCune, Jr. |
| 6,856,263 B2 | 2/2005 | Shokrollahi |
| 6,868,083 B2 | 3/2005 | Apostolopoulos et al. |
| 6,876,623 B1 | 4/2005 | Lou et al. |
| 6,882,618 B1 | 4/2005 | Sakoda et al. |
| 6,895,547 B2 * | 5/2005 | Eleftheriou et al. .......... 714/801 |
| 6,909,383 B2 | 6/2005 | Shokrollahi |
| 6,928,603 B1 | 8/2005 | Castagna et al. |
| 6,937,618 B1 | 8/2005 | Noda et al. |
| 6,956,875 B2 | 10/2005 | Kapadia et al. |
| 6,965,636 B1 | 11/2005 | DesJardins et al. |
| 6,985,459 B2 | 1/2006 | Dickson |
| 6,995,692 B2 | 2/2006 | Yokota et al. |
| 7,010,052 B2 | 3/2006 | Dill et al. |
| 7,030,785 B2 * | 4/2006 | Shokrollahi et al. ............ 341/50 |
| 7,031,257 B1 | 4/2006 | Lu et al. |
| 7,057,534 B2 * | 6/2006 | Luby ............................... 341/50 |
| 7,068,681 B2 | 6/2006 | Chang et al. |
| 7,068,729 B2 * | 6/2006 | Shokrollahi et al. ......... 375/296 |

(56) References Cited

U.S. PATENT DOCUMENTS

| | | |
|---|---|---|
| 7,072,971 B2 | 7/2006 | Lassen et al. |
| 7,073,191 B2 | 7/2006 | Srikantan et al. |
| 7,100,188 B2 | 8/2006 | Hejna et al. |
| 7,110,412 B2 | 9/2006 | Costa et al. |
| 7,139,660 B2 | 11/2006 | Sarkar et al. |
| 7,139,960 B2 * | 11/2006 | Shokrollahi ............... 714/752 |
| 7,143,433 B1 | 11/2006 | Duan et al. |
| 7,151,754 B1 | 12/2006 | Boyce et al. |
| 7,154,951 B2 | 12/2006 | Wang |
| 7,164,370 B1 * | 1/2007 | Mishra ...................... 341/51 |
| 7,164,882 B2 | 1/2007 | Poltorak |
| 7,168,030 B2 | 1/2007 | Ariyoshi |
| 7,219,289 B2 | 5/2007 | Dickson |
| 7,231,404 B2 | 6/2007 | Paila et al. |
| 7,233,264 B2 | 6/2007 | Luby |
| 7,240,236 B2 | 7/2007 | Cutts et al. |
| 7,240,358 B2 | 7/2007 | Horn et al. |
| 7,243,285 B2 * | 7/2007 | Foisy et al. ................. 714/752 |
| 7,254,754 B2 | 8/2007 | Hetzler et al. |
| 7,257,764 B2 | 8/2007 | Suzuki et al. |
| 7,265,688 B2 | 9/2007 | Shokrollahi et al. |
| 7,293,222 B2 | 11/2007 | Shokrollahi et al. |
| 7,295,573 B2 | 11/2007 | Yi et al. |
| 7,304,990 B2 | 12/2007 | Rajwan |
| 7,318,180 B2 | 1/2008 | Starr |
| 7,320,099 B2 | 1/2008 | Miura et al. |
| 7,363,048 B2 | 4/2008 | Cheng et al. |
| 7,391,717 B2 | 6/2008 | Klemets et al. |
| 7,394,407 B2 | 7/2008 | Shokrollahi et al. |
| 7,398,454 B2 | 7/2008 | Cai et al. |
| 7,409,626 B1 | 8/2008 | Schelstraete |
| 7,412,641 B2 | 8/2008 | Shokrollahi |
| 7,418,651 B2 | 8/2008 | Luby et al. |
| 7,451,377 B2 | 11/2008 | Shokrollahi |
| 7,483,447 B2 | 1/2009 | Chang et al. |
| 7,483,489 B2 | 1/2009 | Gentric et al. |
| 7,512,697 B2 | 3/2009 | Lassen et al. |
| 7,525,994 B2 | 4/2009 | Scholte |
| 7,529,806 B1 | 5/2009 | Shteyn |
| 7,532,132 B2 | 5/2009 | Shokrollahi et al. |
| 7,555,006 B2 | 6/2009 | Wolfe et al. |
| 7,559,004 B1 | 7/2009 | Chang et al. |
| 7,570,665 B2 | 8/2009 | Ertel et al. |
| 7,574,706 B2 | 8/2009 | Meulemans et al. |
| 7,590,118 B2 | 9/2009 | Giesberts et al. |
| 7,597,423 B2 | 10/2009 | Silverbrook |
| 7,613,183 B1 | 11/2009 | Brewer et al. |
| 7,633,413 B2 * | 12/2009 | Shokrollahi et al. ............ 341/52 |
| 7,633,970 B2 | 12/2009 | Van Kampen et al. |
| 7,650,036 B2 | 1/2010 | Lei et al. |
| 7,668,198 B2 | 2/2010 | Yi et al. |
| 7,676,735 B2 | 3/2010 | Luby et al. |
| 7,720,096 B2 | 5/2010 | Klemets |
| 7,720,174 B2 | 5/2010 | Shokrollahi et al. |
| 7,721,184 B2 | 5/2010 | Luby et al. |
| 7,812,743 B2 | 10/2010 | Luby |
| 7,831,896 B2 | 11/2010 | Amram et al. |
| 7,924,913 B2 | 4/2011 | Sullivan et al. |
| 7,956,772 B2 | 6/2011 | Shokrollahi et al. |
| 7,961,700 B2 | 6/2011 | Malladi et al. |
| 7,971,129 B2 | 6/2011 | Watson et al. |
| 7,979,769 B2 | 7/2011 | Lee et al. |
| 8,027,328 B2 | 9/2011 | Yang et al. |
| 8,028,322 B2 | 9/2011 | Riedl et al. |
| 8,081,716 B2 | 12/2011 | Kang et al. |
| 8,135,073 B2 | 3/2012 | Shen |
| 8,185,794 B2 | 5/2012 | Lohmar et al. |
| 8,185,809 B2 | 5/2012 | Luby et al. |
| RE43,741 E | 10/2012 | Shokrollahi et al. |
| 8,301,725 B2 | 10/2012 | Biderman et al. |
| 8,327,403 B1 | 12/2012 | Chilvers et al. |
| 8,340,133 B2 | 12/2012 | Kim et al. |
| 8,422,474 B2 | 4/2013 | Park et al. |
| 8,462,643 B2 | 6/2013 | Walton et al. |
| 8,544,043 B2 | 9/2013 | Parekh et al. |
| 8,572,646 B2 | 10/2013 | Haberman et al. |
| 8,615,023 B2 | 12/2013 | Oh et al. |
| 8,638,796 B2 | 1/2014 | Dan et al. |
| 8,713,624 B1 | 4/2014 | Harvey et al. |
| 8,737,421 B2 | 5/2014 | Zhang et al. |
| 8,812,735 B2 | 8/2014 | Igarashi |
| 2001/0015944 A1 | 8/2001 | Takahashi et al. |
| 2001/0033586 A1 | 10/2001 | Takashimizu et al. |
| 2002/0009137 A1 | 1/2002 | Nelson et al. |
| 2002/0053062 A1 | 5/2002 | Szymanski |
| 2002/0083345 A1 | 6/2002 | Halliday et al. |
| 2002/0085013 A1 | 7/2002 | Lippincott |
| 2002/0133247 A1 | 9/2002 | Smith et al. |
| 2002/0141433 A1 | 10/2002 | Kwon et al. |
| 2002/0143953 A1 | 10/2002 | Aiken |
| 2002/0191116 A1 | 12/2002 | Kessler et al. |
| 2003/0005386 A1 | 1/2003 | Bhatt et al. |
| 2003/0037299 A1 | 2/2003 | Smith |
| 2003/0086515 A1 | 5/2003 | Trans et al. |
| 2003/0101408 A1 | 5/2003 | Martinian et al. |
| 2003/0106014 A1 | 6/2003 | Dohmen et al. |
| 2003/0138043 A1 | 7/2003 | Hannuksela |
| 2003/0194211 A1 | 10/2003 | Abecassis |
| 2003/0207696 A1 | 11/2003 | Willenegger et al. |
| 2003/0224773 A1 | 12/2003 | Deeds |
| 2003/0226089 A1 | 12/2003 | Rasmussen et al. |
| 2004/0015768 A1 | 1/2004 | Bordes et al. |
| 2004/0031054 A1 | 2/2004 | Dankworth et al. |
| 2004/0049793 A1 | 3/2004 | Chou |
| 2004/0066854 A1 | 4/2004 | Hannuksela |
| 2004/0081106 A1 | 4/2004 | Bruhn |
| 2004/0096110 A1 | 5/2004 | Yogeshwar et al. |
| 2004/0117716 A1 | 6/2004 | Shen |
| 2004/0151109 A1 | 8/2004 | Batra et al. |
| 2004/0162071 A1 | 8/2004 | Grilli et al. |
| 2004/0207548 A1 | 10/2004 | Kilbank |
| 2004/0231004 A1 | 11/2004 | Seo |
| 2004/0240382 A1 | 12/2004 | Ido et al. |
| 2004/0255328 A1 | 12/2004 | Baldwin et al. |
| 2005/0018635 A1 | 1/2005 | Proctor |
| 2005/0028067 A1 | 2/2005 | Weirauch |
| 2005/0041736 A1 | 2/2005 | Butler-Smith et al. |
| 2005/0071491 A1 | 3/2005 | Seo |
| 2005/0091697 A1 | 4/2005 | Tanaka et al. |
| 2005/0097213 A1 | 5/2005 | Barrett et al. |
| 2005/0102371 A1 | 5/2005 | Aksu |
| 2005/0105371 A1 | 5/2005 | Johnson et al. |
| 2005/0123058 A1 | 6/2005 | Greenbaum et al. |
| 2005/0138286 A1 | 6/2005 | Franklin et al. |
| 2005/0160272 A1 | 7/2005 | Teppler |
| 2005/0163468 A1 | 7/2005 | Takahashi et al. |
| 2005/0169379 A1 | 8/2005 | Shin et al. |
| 2005/0180415 A1 | 8/2005 | Cheung et al. |
| 2005/0193309 A1 | 9/2005 | Grilli et al. |
| 2005/0195752 A1 | 9/2005 | Amin et al. |
| 2005/0195899 A1 | 9/2005 | Han |
| 2005/0195900 A1 | 9/2005 | Han |
| 2005/0207392 A1 | 9/2005 | Sivalingham et al. |
| 2005/0216472 A1 | 9/2005 | Leon et al. |
| 2005/0216951 A1 | 9/2005 | MacInnis |
| 2005/0254575 A1 | 11/2005 | Hannuksela et al. |
| 2006/0015568 A1 | 1/2006 | Walsh et al. |
| 2006/0020796 A1 | 1/2006 | Aura et al. |
| 2006/0031738 A1 | 2/2006 | Fay et al. |
| 2006/0037057 A1 | 2/2006 | Xu |
| 2006/0093634 A1 | 5/2006 | Lutz et al. |
| 2006/0107174 A1 | 5/2006 | Heise |
| 2006/0109805 A1 | 5/2006 | Malamal Vadakital et al. |
| 2006/0120464 A1 | 6/2006 | Hannuksela |
| 2006/0193524 A1 | 8/2006 | Tarumoto et al. |
| 2006/0212444 A1 | 9/2006 | Handman et al. |
| 2006/0212782 A1 | 9/2006 | Li |
| 2006/0229075 A1 | 10/2006 | Kim et al. |
| 2006/0244824 A1 | 11/2006 | Debey |
| 2006/0244865 A1 | 11/2006 | Simon |
| 2006/0248195 A1 | 11/2006 | Toumura et al. |
| 2006/0256851 A1 | 11/2006 | Wang et al. |
| 2006/0262856 A1 | 11/2006 | Wu et al. |
| 2006/0279437 A1 | 12/2006 | Luby et al. |

(56) References Cited

U.S. PATENT DOCUMENTS

| | | |
|---|---|---|
| 2006/0280254 A1 | 12/2006 | Luby |
| 2007/0002953 A1 | 1/2007 | Kusunoki |
| 2007/0006274 A1 | 1/2007 | Paila et al. |
| 2007/0016594 A1 | 1/2007 | Visharam et al. |
| 2007/0022215 A1 | 1/2007 | Singer et al. |
| 2007/0028099 A1 | 2/2007 | Entin et al. |
| 2007/0078876 A1 | 4/2007 | Hayashi et al. |
| 2007/0081562 A1 | 4/2007 | Ma |
| 2007/0081586 A1 | 4/2007 | Raveendran et al. |
| 2007/0110074 A1 | 5/2007 | Bradley et al. |
| 2007/0127576 A1 | 6/2007 | Henocq et al. |
| 2007/0134005 A1 | 6/2007 | Myong et al. |
| 2007/0140369 A1 | 6/2007 | Limberg et al. |
| 2007/0157267 A1 | 7/2007 | Lopez-Estrada |
| 2007/0162568 A1 | 7/2007 | Gupta et al. |
| 2007/0162611 A1 | 7/2007 | Yu et al. |
| 2007/0176800 A1 | 8/2007 | Rijavec |
| 2007/0177811 A1 | 8/2007 | Yang et al. |
| 2007/0185973 A1 | 8/2007 | Wayda et al. |
| 2007/0195894 A1 | 8/2007 | Shokrollahi |
| 2007/0200949 A1 | 8/2007 | Walker et al. |
| 2007/0201549 A1 | 8/2007 | Hannuksela et al. |
| 2007/0204196 A1 | 8/2007 | Watson et al. |
| 2007/0230568 A1 | 10/2007 | Eleftheriadis et al. |
| 2007/0233784 A1 | 10/2007 | O'Rourke et al. |
| 2007/0255844 A1 | 11/2007 | Shen et al. |
| 2007/0277209 A1 | 11/2007 | Yousef |
| 2007/0300127 A1 | 12/2007 | Watson et al. |
| 2008/0010153 A1 | 1/2008 | Pugh-O'Connor et al. |
| 2008/0034273 A1 | 2/2008 | Luby |
| 2008/0052753 A1 | 2/2008 | Huang et al. |
| 2008/0058958 A1 | 3/2008 | Cheng |
| 2008/0059532 A1 | 3/2008 | Kazmi et al. |
| 2008/0066136 A1 | 3/2008 | Dorai et al. |
| 2008/0075172 A1 | 3/2008 | Koto |
| 2008/0086751 A1 | 4/2008 | Horn et al. |
| 2008/0101478 A1 | 5/2008 | Kusunoki |
| 2008/0134005 A1 | 6/2008 | Izzat et al. |
| 2008/0152241 A1 | 6/2008 | Itoi et al. |
| 2008/0168133 A1 | 7/2008 | Osborne |
| 2008/0168516 A1 | 7/2008 | Flick et al. |
| 2008/0170564 A1 | 7/2008 | Shi et al. |
| 2008/0170806 A1 | 7/2008 | Kim |
| 2008/0172430 A1 | 7/2008 | Thorstensen |
| 2008/0172712 A1 | 7/2008 | Munetsugu |
| 2008/0181296 A1 | 7/2008 | Tian et al. |
| 2008/0189419 A1 | 8/2008 | Girle et al. |
| 2008/0192818 A1 | 8/2008 | DiPietro et al. |
| 2008/0215317 A1 | 9/2008 | Fejzo |
| 2008/0232357 A1 | 9/2008 | Chen |
| 2008/0243918 A1 | 10/2008 | Holtman |
| 2008/0256418 A1 | 10/2008 | Luby et al. |
| 2008/0281943 A1 | 11/2008 | Shapiro |
| 2008/0285556 A1 | 11/2008 | Park et al. |
| 2008/0303893 A1 | 12/2008 | Kim et al. |
| 2008/0303896 A1 | 12/2008 | Lipton et al. |
| 2008/0309525 A1* | 12/2008 | Shokrollahi et al. ............ 341/94 |
| 2008/0313191 A1 | 12/2008 | Bouazizi |
| 2009/0003439 A1 | 1/2009 | Wang et al. |
| 2009/0019229 A1 | 1/2009 | Morrow et al. |
| 2009/0031199 A1 | 1/2009 | Luby et al. |
| 2009/0043906 A1 | 2/2009 | Hurst et al. |
| 2009/0055705 A1 | 2/2009 | Gao |
| 2009/0067551 A1 | 3/2009 | Chen et al. |
| 2009/0083806 A1 | 3/2009 | Barrett et al. |
| 2009/0089445 A1 | 4/2009 | Deshpande |
| 2009/0092138 A1 | 4/2009 | Joo et al. |
| 2009/0100496 A1 | 4/2009 | Bechtolsheim et al. |
| 2009/0103523 A1 | 4/2009 | Katis et al. |
| 2009/0106356 A1 | 4/2009 | Brase et al. |
| 2009/0125636 A1 | 5/2009 | Li et al. |
| 2009/0150557 A1 | 6/2009 | Wormley et al. |
| 2009/0158114 A1 | 6/2009 | Shokrollahi |
| 2009/0164653 A1 | 6/2009 | Mandyam et al. |
| 2009/0189792 A1 | 7/2009 | Shokrollahi et al. |
| 2009/0195640 A1 | 8/2009 | Kim et al. |
| 2009/0201990 A1 | 8/2009 | Leprovost et al. |
| 2009/0204877 A1 | 8/2009 | Betts |
| 2009/0210547 A1 | 8/2009 | Lassen et al. |
| 2009/0222873 A1 | 9/2009 | Einarsson |
| 2009/0248697 A1 | 10/2009 | Richardson et al. |
| 2009/0257508 A1 | 10/2009 | Aggarwal et al. |
| 2009/0287841 A1 | 11/2009 | Chapweske et al. |
| 2009/0297123 A1 | 12/2009 | Virdi et al. |
| 2009/0300203 A1 | 12/2009 | Virdi et al. |
| 2009/0300204 A1 | 12/2009 | Zhang et al. |
| 2009/0307565 A1 | 12/2009 | Luby et al. |
| 2009/0319563 A1 | 12/2009 | Schnell |
| 2009/0328228 A1 | 12/2009 | Schnell |
| 2010/0011061 A1 | 1/2010 | Hudson et al. |
| 2010/0011117 A1 | 1/2010 | Hristodorescu et al. |
| 2010/0011274 A1 | 1/2010 | Stockhammer et al. |
| 2010/0020871 A1 | 1/2010 | Hannuksela et al. |
| 2010/0023525 A1 | 1/2010 | Westerlund et al. |
| 2010/0046906 A1 | 2/2010 | Kanamori et al. |
| 2010/0049865 A1 | 2/2010 | Hannuksela et al. |
| 2010/0061444 A1 | 3/2010 | Wilkins et al. |
| 2010/0067495 A1 | 3/2010 | Lee et al. |
| 2010/0103001 A1 | 4/2010 | Shokrollahi et al. |
| 2010/0131671 A1 | 5/2010 | Kohli et al. |
| 2010/0153578 A1 | 6/2010 | Van Gassel et al. |
| 2010/0165077 A1 | 7/2010 | Yin et al. |
| 2010/0174823 A1 | 7/2010 | Huang |
| 2010/0189131 A1 | 7/2010 | Branam et al. |
| 2010/0198982 A1 | 8/2010 | Fernandez |
| 2010/0211690 A1 | 8/2010 | Pakzad et al. |
| 2010/0223533 A1 | 9/2010 | Stockhammer et al. |
| 2010/0235472 A1 | 9/2010 | Sood et al. |
| 2010/0235528 A1 | 9/2010 | Bocharov et al. |
| 2010/0257051 A1 | 10/2010 | Fernandez |
| 2010/0318632 A1 | 12/2010 | Yoo et al. |
| 2011/0019769 A1 | 1/2011 | Shokrollahi et al. |
| 2011/0055881 A1 | 3/2011 | Yu et al. |
| 2011/0083144 A1 | 4/2011 | Bocharov et al. |
| 2011/0096828 A1 | 4/2011 | Chen et al. |
| 2011/0119394 A1 | 5/2011 | Wang et al. |
| 2011/0119396 A1 | 5/2011 | Kwon et al. |
| 2011/0216541 A1 | 9/2011 | Inoue et al. |
| 2011/0231519 A1 | 9/2011 | Luby et al. |
| 2011/0231569 A1 | 9/2011 | Luby et al. |
| 2011/0238789 A1 | 9/2011 | Luby et al. |
| 2011/0239078 A1 | 9/2011 | Luby et al. |
| 2011/0258510 A1 | 10/2011 | Watson et al. |
| 2011/0268178 A1 | 11/2011 | Park et al. |
| 2011/0280311 A1 | 11/2011 | Chen et al. |
| 2011/0280316 A1 | 11/2011 | Chen et al. |
| 2011/0299629 A1 | 12/2011 | Luby et al. |
| 2011/0307545 A1 | 12/2011 | Bouazizi |
| 2011/0307581 A1 | 12/2011 | Furbeck et al. |
| 2012/0013746 A1 | 1/2012 | Chen et al. |
| 2012/0016965 A1 | 1/2012 | Chen et al. |
| 2012/0020413 A1 | 1/2012 | Chen et al. |
| 2012/0023249 A1 | 1/2012 | Chen et al. |
| 2012/0023254 A1 | 1/2012 | Park et al. |
| 2012/0033730 A1 | 2/2012 | Lee |
| 2012/0042050 A1 | 2/2012 | Chen et al. |
| 2012/0042089 A1 | 2/2012 | Chen et al. |
| 2012/0042090 A1 | 2/2012 | Chen et al. |
| 2012/0047280 A1 | 2/2012 | Park et al. |
| 2012/0099593 A1 | 4/2012 | Luby |
| 2012/0151302 A1 | 6/2012 | Luby et al. |
| 2012/0185530 A1 | 7/2012 | Reza |
| 2012/0202535 A1 | 8/2012 | Chaddha et al. |
| 2012/0207068 A1 | 8/2012 | Watson et al. |
| 2012/0208580 A1 | 8/2012 | Luby et al. |
| 2012/0210190 A1 | 8/2012 | Luby et al. |
| 2012/0317305 A1 | 12/2012 | Einarsson et al. |
| 2013/0002483 A1 | 1/2013 | Rowitch et al. |
| 2013/0007223 A1 | 1/2013 | Luby et al. |
| 2013/0067295 A1 | 3/2013 | Luby et al. |
| 2013/0091251 A1 | 4/2013 | Walker et al. |
| 2013/0246643 A1 | 9/2013 | Luby et al. |
| 2013/0254634 A1 | 9/2013 | Luby |

(56) References Cited

U.S. PATENT DOCUMENTS

| | | | |
|---|---|---|---|
| 2013/0287023 A1 | 10/2013 | Bims | |
| 2014/0009578 A1 | 1/2014 | Chen et al. | |
| 2014/0380113 A1 | 12/2014 | Luby | |

FOREIGN PATENT DOCUMENTS

| | | |
|---|---|---|
| CN | 1481643 A | 3/2004 |
| CN | 1708934 A | 12/2005 |
| CN | 1714577 A | 12/2005 |
| CN | 1792056 A | 6/2006 |
| CN | 1806392 A | 7/2006 |
| CN | 1819661 A | 8/2006 |
| CN | 1868157 A | 11/2006 |
| CN | 101390399 A | 3/2009 |
| CN | 101729857 A | 6/2010 |
| EP | 0669587 A2 | 8/1995 |
| EP | 0701371 A1 | 3/1996 |
| EP | 0784401 A2 | 7/1997 |
| EP | 0853433 A1 | 7/1998 |
| EP | 0854650 A2 | 7/1998 |
| EP | 0903955 A1 | 3/1999 |
| EP | 0986908 A1 | 3/2000 |
| EP | 1024672 A1 | 8/2000 |
| EP | 1051027 A1 | 11/2000 |
| EP | 1124344 A1 | 8/2001 |
| EP | 1241795 A2 | 9/2002 |
| EP | 1298931 A2 | 4/2003 |
| EP | 1406452 A2 | 4/2004 |
| EP | 1455504 A2 | 9/2004 |
| EP | 1468497 A1 | 10/2004 |
| EP | 1501318 A1 | 1/2005 |
| EP | 1670256 A2 | 6/2006 |
| EP | 1755248 A1 | 2/2007 |
| EP | 2046044 A1 | 4/2009 |
| EP | 2071827 A2 | 6/2009 |
| EP | 2096870 A2 | 9/2009 |
| EP | 1700410 B1 | 4/2010 |
| EP | 2323390 A2 | 5/2011 |
| JP | H07183873 | 7/1995 |
| JP | 08186570 | 7/1996 |
| JP | 8289255 A | 11/1996 |
| JP | 9252253 A | 9/1997 |
| JP | 11041211 A | 2/1999 |
| JP | 11112479 | 4/1999 |
| JP | 11164270 A | 6/1999 |
| JP | 2000151426 A | 5/2000 |
| JP | 2000216835 A | 8/2000 |
| JP | 2000513164 A | 10/2000 |
| JP | 2000307435 A | 11/2000 |
| JP | 2000353969 A | 12/2000 |
| JP | 2001036417 | 2/2001 |
| JP | 2001094625 | 4/2001 |
| JP | 2001189665 A | 7/2001 |
| JP | 2001223655 A | 8/2001 |
| JP | 2001251287 A | 9/2001 |
| JP | 2001274776 A | 10/2001 |
| JP | 2001274855 A | 10/2001 |
| JP | 2002073625 A | 3/2002 |
| JP | 2002204219 A | 7/2002 |
| JP | 2002543705 A | 12/2002 |
| JP | 2003018568 A | 1/2003 |
| JP | 2003507985 | 2/2003 |
| JP | 2003092564 A | 3/2003 |
| JP | 2003510734 A | 3/2003 |
| JP | 2003174489 | 6/2003 |
| JP | 2003256321 A | 9/2003 |
| JP | 2003318975 A | 11/2003 |
| JP | 2003319012 | 11/2003 |
| JP | 2003333577 A | 11/2003 |
| JP | 2004048704 A | 2/2004 |
| JP | 2004070712 A | 3/2004 |
| JP | 2004135013 A | 4/2004 |
| JP | 2004165922 A | 6/2004 |
| JP | 2004516717 A | 6/2004 |
| JP | 2004192140 A | 7/2004 |
| JP | 2004193992 A | 7/2004 |
| JP | 2004529533 A | 9/2004 |
| JP | 2004289621 A | 10/2004 |
| JP | 2004343701 A | 12/2004 |
| JP | 2004348824 A | 12/2004 |
| JP | 2004362099 A | 12/2004 |
| JP | 2005094140 A | 4/2005 |
| JP | 2005136546 A | 5/2005 |
| JP | 2005514828 T | 5/2005 |
| JP | 2005204170 A | 7/2005 |
| JP | 2005223433 A | 8/2005 |
| JP | 2005277950 A | 10/2005 |
| JP | 2006503463 A | 1/2006 |
| JP | 2006505177 A | 2/2006 |
| JP | 2006506926 A | 2/2006 |
| JP | 2006074335 A | 3/2006 |
| JP | 2006074421 A | 3/2006 |
| JP | 2006115104 A | 4/2006 |
| JP | 3809957 | 6/2006 |
| JP | 2006174032 A | 6/2006 |
| JP | 2006174045 A | 6/2006 |
| JP | 2006186419 A | 7/2006 |
| JP | 2006519517 A | 8/2006 |
| JP | 2006287422 A | 10/2006 |
| JP | 2006319743 A | 11/2006 |
| JP | 2007013675 A | 1/2007 |
| JP | 2007089137 A | 4/2007 |
| JP | 3976163 | 6/2007 |
| JP | 2007158592 A | 6/2007 |
| JP | 2007174170 A | 7/2007 |
| JP | 2007520961 A | 7/2007 |
| JP | 2007228205 A | 9/2007 |
| JP | 2008011404 A | 1/2008 |
| JP | 2008016907 A | 1/2008 |
| JP | 2008502212 A | 1/2008 |
| JP | 2008508761 A | 3/2008 |
| JP | 2008508762 A | 3/2008 |
| JP | 2008283232 A | 11/2008 |
| JP | 2008283571 A | 11/2008 |
| JP | 2008543142 A | 11/2008 |
| JP | 2008546361 A | 12/2008 |
| JP | 2009027598 A | 2/2009 |
| JP | 2009522921 A | 6/2009 |
| JP | 2009522922 A | 6/2009 |
| JP | 2009171558 A | 7/2009 |
| JP | 2009527949 A | 7/2009 |
| JP | 2009277182 A | 11/2009 |
| JP | 2009544991 A | 12/2009 |
| JP | 2010539832 A | 12/2010 |
| JP | 2011087103 A | 4/2011 |
| JP | 4971144 B2 | 7/2012 |
| JP | 5231218 | 3/2013 |
| KR | 1020030071815 | 9/2003 |
| KR | 1020030074386 A | 9/2003 |
| KR | 20040107152 A | 12/2004 |
| KR | 20040107401 A | 12/2004 |
| KR | 20050009376 A | 1/2005 |
| KR | 100809086 B1 | 3/2008 |
| KR | 20080083299 A | 9/2008 |
| KR | 20090098919 A | 9/2009 |
| KR | 20100028156 A | 3/2010 |
| RU | 99117925 A | 7/2001 |
| RU | 2189629 C2 | 9/2002 |
| RU | 2265960 C2 | 12/2005 |
| RU | 2290768 C1 | 12/2006 |
| RU | 2297663 C2 | 4/2007 |
| RU | 2312390 C2 | 12/2007 |
| RU | 2357279 C2 | 5/2009 |
| TW | I246841 B | 1/2006 |
| TW | I354908 | 12/2011 |
| TW | I355168 | 12/2011 |
| WO | WO9634463 A1 | 10/1996 |
| WO | WO-9750183 A1 | 12/1997 |
| WO | WO9804973 A1 | 2/1998 |
| WO | WO-9832256 A1 | 7/1998 |
| WO | WO98032231 | 7/1998 |
| WO | WO0014921 A1 | 3/2000 |
| WO | WO0018017 | 3/2000 |

(56) References Cited

FOREIGN PATENT DOCUMENTS

| | | |
|---|---|---|
| WO | WO0052600 A1 | 9/2000 |
| WO | WO0120786 A1 | 3/2001 |
| WO | WO0157667 A1 | 8/2001 |
| WO | WO0158130 A2 | 8/2001 |
| WO | WO0158131 A2 | 8/2001 |
| WO | WO0227988 A2 | 4/2002 |
| WO | WO0247391 A1 | 6/2002 |
| WO | 02063461 A1 | 8/2002 |
| WO | WO-03046742 A1 | 6/2003 |
| WO | WO03056703 | 7/2003 |
| WO | WO03105350 | 12/2003 |
| WO | WO-03105484 A1 | 12/2003 |
| WO | WO2004008735 A2 | 1/2004 |
| WO | WO2004015948 A1 | 2/2004 |
| WO | WO2004019521 A1 | 3/2004 |
| WO | WO2004030273 A1 | 4/2004 |
| WO | WO2004034589 A2 | 4/2004 |
| WO | WO-2004036824 A1 | 4/2004 |
| WO | WO2004040831 A1 | 5/2004 |
| WO | WO-2004047019 A2 | 6/2004 |
| WO | WO2004047455 A1 | 6/2004 |
| WO | WO-2004088988 A1 | 10/2004 |
| WO | WO-2004109538 A1 | 12/2004 |
| WO | WO2005036753 A2 | 4/2005 |
| WO | WO2005041421 A1 | 5/2005 |
| WO | WO2005078982 A1 | 8/2005 |
| WO | WO-2005107123 | 11/2005 |
| WO | WO2005112250 A2 | 11/2005 |
| WO | WO-2006013459 A1 | 2/2006 |
| WO | WO2006020826 A2 | 2/2006 |
| WO | WO-2006036276 | 4/2006 |
| WO | 2006060036 A1 | 6/2006 |
| WO | WO-2006057938 A2 | 6/2006 |
| WO | WO2006084503 A1 | 8/2006 |
| WO | WO-2006116102 A2 | 11/2006 |
| WO | WO-2006135878 A2 | 12/2006 |
| WO | WO2007042916 | 4/2007 |
| WO | 2007078253 A2 | 7/2007 |
| WO | WO2007090834 A2 | 8/2007 |
| WO | WO-2007098397 A2 | 8/2007 |
| WO | WO-2007098480 A1 | 8/2007 |
| WO | 2008011549 A2 | 1/2008 |
| WO | WO-2008023328 A3 | 4/2008 |
| WO | WO2008054100 A1 | 5/2008 |
| WO | 2008086313 A1 | 7/2008 |
| WO | WO2008085013 A1 | 7/2008 |
| WO | WO-2008131023 A1 | 10/2008 |
| WO | 2008144004 A1 | 11/2008 |
| WO | WO2008148708 A1 | 12/2008 |
| WO | WO2008156390 A1 | 12/2008 |
| WO | WO-2009065526 A1 | 5/2009 |
| WO | WO-2009137705 A2 | 11/2009 |
| WO | 2009143741 A1 | 12/2009 |
| WO | WO2010085361 A2 | 7/2010 |
| WO | WO2010088420 A1 | 8/2010 |
| WO | WO2010120804 A1 | 10/2010 |
| WO | WO-2011038013 | 3/2011 |
| WO | WO-2011038034 A1 | 3/2011 |
| WO | 2011059286 A2 | 5/2011 |
| WO | 2011070552 A1 | 6/2011 |
| WO | 2011102792 A1 | 8/2011 |
| WO | WO-2012021540 | 2/2012 |
| WO | WO-2012109614 A1 | 8/2012 |

OTHER PUBLICATIONS

3GPP TS 26.244 V9.1.0, 3rd Generation Partnership Project; Technical Specification Group Services and System Aspects; Transparent end-to-end packet switched streaming service (PSS); 3GPP file format (3GP), (Release 9), Mar. 2010, 55 pp.

3GPP TS 26.247, v1.5.0, 3rd Generation Partnership Project; Technical Specification Group Services and System Aspects Transparent end-to-end Packet-switched Streaming Service (PSS); Progressive Download and Dynamic Adaptive Streaming over HTTP (3GP-DASH) (Release 10), 2010.

3rd Generation Partnership Project, Technical Specification Group Services and System Aspects Transparent end-to-end packet switched streaming service (PSS), 3GPP file format (3GP) (Release 8), 3GPP Standard, 3GPP TS 26.244, 3RD Generation Partnership Project (3GPP), Mobile Competence Centre , 650, Route Des Lucioles , F-06921 Sophia-Antipolis Cedex , France, No. V8.1.0, Jun. 1, 2009, pp. 1-52, XP050370199.

"3rd Generation Partnership Project; Technical Specification Group Services and System Aspects; Transparent end-to-end packet switched streaming service (PSS); 3GPP file format (3GP) (Release 9)", 3GPP Standard; 3GPP TS 26.244, 3RD Generation Partnership Project (3GPP), Mobile Competence Centre; 650, Route Des Lucioles; F-06921 Sophia-Antipolis Cedex; France, No. V9.2.0, Jun. 9, 2010, pp. 1-55, XP050441544, [retrieved on Jun. 6, 2010].

Afzal et al., "Video Streaming over MBMS: A System Design Approach", Journal of Multimedia, vol. 1, No. 5, Aug. 2006, pp. 25-35.

Aggarwal, C. et al.: "A Permutation-Based Pyramid Broadcasting Scheme for Video-on-Demand Systems," Proc. IEEE Int'l Conf. on Multimedia Systems, Hiroshima, Japan (Jun. 1996).

Aggarwal, C. et al.: "On Optimal Batching Policies for Video-on-Demand Storage Servers," Multimedia Systems, vol. 4, No. 4, pp. 253-258 (1996).

Alex Zambelli,"IIS Smooth Streaming Technical Overview", Microsoft Mar. 25, 2009, XP002620446, Retrieved from the Internet: URL:http://www.microsoft.com/downloads/en/ details. aspx?FamilyID=03d22583-3ed6-44da-8464-blb4b5ca7520, [retrieved on Jan. 1, 2011].

Aljoscha Smolic et al., "Development of a New MPEG Standard for Advanced 3D Video Applications", IEEE International Symposium on Image and Signal Processing and Analysis, Sep. 16, 2009, pp. 400-407, XP031552049, ISBN: 978-953-184-135-1.

Almeroth, et al., "The use of multicast delivery to provide a scalable and interactive video-on-demand service", IEEE Journal on Selected Areas in Communication, 14(6): 1110-1122, (1996).

Alon, et al.: "Linear Time Erasure Codes with Nearly Optimal Recovery," Proceedings of the Annual Symposium on Foundations of Computer Science, US, Los Alamitos, IEEE Comp. Soc. Press, vol. Symp. 36, pp. 512-516 (Oct. 23, 1995) XP000557871.

Amin Shokrollahi: "LDPC Codes: An Introduction" Internet Citation Apr. 2, 2003, XP002360065 Retrieved from the Internet: URL : http ://www . ipm. ac . ir/IPM/homepage/Amin 2. pdf [retrieved on Dec. 19, 2005].

Amon P et al., "File Format for Scalable Video Coding", IEEE Transactions on Circuits and Systems for Video Technology, IEEE Service Center, Piscataway, NJ, US, vol. 17, No. 9, Sep. 1, 2007, pp. 1174-1185, XP011193013, ISSN: 1051-8215, DOI:10.1109/TCSVT.2007.905521.

Anonymous: "Text of ISO/IEC 13818-1:2007/PDAM 6 MVC operation point descriptor", 90 MPEG Meeting; Oct. 26-30, 2009; Xian; (Motion Picture Expertgroup or ISO/IEC JTC1/SC29/WG11), No. N10942, Nov. 19, 2009, XP030017441.

Anonymous: "Text of ISO/IEC 14496-12 3rd Edition", 83 MPEG Meeting; Jan. 14-18, 2008; Antalya; (Motion Pictureexpert Group or ISO/IEC JTC1/SC29/WG11), No. N9678, Apr. 22, 2008, XP030016172.

Anonymous: "Text of ISO/IEC 14496-15 2nd edition", 91 MPEG Meeting; Jan. 18-22, 2010; Kyoto; (Motion Picture Expertgroup or ISO/IEC JTC1/SC29/WG11), No. N11139, Jan. 22, 2010, XP030017636.

Apple Inc., "On the time-stamps in the segment-inbox for HTTP streaming (26.244, R9)", TSG-SA4#58 meeting, Vancouver, Canada, Apr. 2010, p. 5.

Bar-Noy, et al., "Competitive on-line stream merging algorithms for media-on-demand", Draft (Jul. 2000), pp. 1-34.

Bar-Noy et al. "Efficient algorithms for optimal stream merging for media-on-demand," Draft (Aug. 2000), pp. 1-43.

Bigloo, A. et al.: "A Robust Rate-Adaptive Hybrid ARQ Scheme and Frequency Hopping for Multiple-Access Communication Systems," IEEE Journal on Selected Areas in Communications, US, IEEE Inc, New York (Jun. 1, 1994) pp. 917-924, XP000464977.

(56) References Cited

OTHER PUBLICATIONS

Bitner, J.R., et al.: "Efficient Generation of the Binary Reflected Gray code and Its Applications," Communications of the ACM, pp. 517-521, vol. 19 (9), 1976.
Blomer, et al., "An XOR-Based Erasure-Resilient Coding Scheme," ICSI Technical Report No. TR-95-048 (1995) [avail. At ftp://ftp.icsi.berkeley.edu/pub/techreports/1995/tr-95-048.pdf].
Byers, J.W. et al.: "A Digital Fountain Approach to Reliable Distribution of Bulk Data," Computer Communication Review, Association for Computing Machinery. New York, US, vol. 28, No. 4 (Oct. 1998) pp. 56-67 XP000914424 ISSN:0146-4833.
Charles Lee L.H, "Error-Control Block Codes for Communications Engineers", 2000, Artech House, XP002642221.
Chen, et al., U.S. Patent Application titled "Frame Packing for Asymmetric Stereo Video", filed Feb. 25, 2011.
Chen, et al., U.S. Patent Application titled "One-Stream Coding for Asymmetric Stereo Video", filed Feb. 25, 2011.
Chen Ying et al., "Coding techniques in Multiview Video Coding and Joint Multiview Video Model", Picture Coding Symposium, 2009, PCS 2009, IEEE, Piscataway, NJ, USA, May 6, 2009, pp. 1-4, XP031491747, ISBN: 978-1-4244-4593-6.
Clark G.C., et al., "Error Correction Coding for Digital Communications, System Applications," Error Correction Coding for Digital Communications, New York, Plenum Press, US, Jan. 1, 1981, pp. 339-341.
Dan, A. et al.: "Scheduling Policies for an On-Demand Video Server with Batching," Proc. ACM Multimedia, pp. 391-398 (Oct. 1998).
Davey, M.C. et al.: "Low Density Parity Check Codes over GF(q)" IEEE Communications Letters, vol. 2, No. 6 pp. 165-167 (1998).
David Singer, et al., "ISO/IEC 14496-15/FDIS, International Organization for Standardization Organization Internationale De Normalization ISO/IEC JTC1/SC29/WG11 Coding of Moving Pictures and Audio", ISO/IEC 2003, Aug. 11, 2003, pp. 1-34.
Digital Fountain: "Raptor code specification for MBMS file download," 3GPP SA4 PSM Ad-Hoc #31 (May 21, 2004) XP002355055 pp. 1-6.
Digital Fountain: "Specification Text for Raptor Forward Error Correction," TDOC S4-050249 of 3GPP TSG SA WG 4 Meeting #34 [Online] (Feb. 25, 2005) pp. 1-23, XP002425167, Retrieved from the Internet: URL:http://www.3gpp.org/ftp/tsg_sa/WG4_CODEC/TSGS4_34/Docs.
D.M. Mandelbaum: "An adaptive-feedback coding scheme using incremental redundancy", IEEE Trans on Information Theory, vol. May 1974, pp. 388-389, XP002628271, the whole document.
Eager, et al. "Minimizing bandwidth requirements for on-demand data delivery," Proceedings of the International Workshop on Advances in Multimedia Information Systems,p. 80-87 (Indian Wells, CA Oct. 1999).
Eager, et al., "Optimal and efficient merging schedules for video-on-demand servers", Proc. ACM Multimedia, vol. 7, pp. 199-203 (1999).
Esaki, et al.: "Reliable IP Multicast Communication Over ATM Networks Using Forward Error Correction Policy," IEICE Transactions on Communications, JP, Institute of Electronics Information and Comm. ENG. Tokyo, vol. E78-V, No. 12, (Dec. 1995), pp. 1622-1637, XP000556183.
Feng, G., Error Correcting Codes over Z2m for Algorithm-Based Fault-Tolerance, IEEE Transactions on Computers, vol. 43, No. 3, Mar. 1994, pp. 370-374.
Fernando et al., "HTTP Streaming of MPEG Media—Response to CfP", 93 MPEG Meeting; Jul. 26-30, 2010; Geneva; (Motion Picture Expert Group or ISO/IEC JTC1/SCE29/WG11), No. M17756, Jul. 22, 2010, XP030046346.
Fielding, et al., "Hypertext Transfer Protocol—HTTP/1.1," Network Working Group, RFC 2616, Jun. 1999, 165 pp.
Frojdh, et al., "File format sub-track selection and switching," ISO/IEC JTC1/SC29/WG11 MPEG2009 M16665, London UK., Jul. 2009, 14 pp.
Gao, L. et al.: "Efficient Schemes for Broadcasting Popular Videos," Proc. Inter. Workshop on Network and Operating System Support for Digital Audio and Video, pp. 1-13 (1998).

Gemmell, et al., "A Scalable Multicast Architecture for One-To-Many Telepresentations", Multimedia Computing and Systems, 1998/ Proceedings. IEEE International Conference on Austin, TX, USA Jun. 28-Jul. 1, 1998, Los Alamitos, CA USA, IEEE Comput. Soc, US, Jun. 28, 1998, pp. 128-139, XP010291559.
Grineberg, et al., "Deliverable D3.2 MVC/SVC storage format" Jan. 29, 2009, XP002599508 Retrieved from the Internet: URL:http://www.ist-sea.eu/Public/SEA_D3.2_HHI FF_20090129.pdf [retrieved on Sep. 1, 2010] paragraph [02.3].
Hagenauer, J. : "Soft is better than hard" Communications, Coding and Cryptology, Kluwer Publication May 1994, XP002606615 Retrieved from the Internet : URL:http://www. Int . ei .turn. de/veroeffentlic hungen/I994/ccc94h. pdf [retrieved on Oct. 25, 2010].
He Wenge et al., "Asymmetric Stereoscopic Video Encoding Algorithm Based on Joint Compensation Prediction", IEEE International Conference on Communications and Mobile Computing, Jan. 6, 2009, pp. 191-194, XP031434775, ISBN: 978-0-7695-3501-2.
Hershey, et al., "Random Parity Coding (RPC)", 1996 IEEE International Conference on Communications (ICC). Converging Technologies for Tomorrow'S Applications. Dallas, Jun. 23-27, 1996, IEEE International Conference on Communications (ICC), New York, IEEE, US, vol. 1, Jun. 23, 1996, pp. 122-126, XP000625654.
Hitachi Ltd. et al., "High-Definition Multimedia Interface," Specification Version 1.4, Jun. 5, 2009, 425 pp.
Hua, et al., "Skyscraper broadcasting: A new broadcsting system for metropolitan video-on-demand systems", Proc. ACM SIGCOMM, pp. 89-100 (Cannes, France, 1997).
Ian Trow, "Is 3D Event Coverage Using Existing Broadcast Infrastructure Technically Possible?", International Broadcasting Conference, Sep. 9-13, 2009, XP030081671, pp. 4-5, "3D transmission over broadcast infrastructure" pp. 7-8, "Screen signaling" —Conclusions on 3D systems.
Information Technology—Generic Coding of Moving Pictures and Audio: Systems, Amendment 4: Transport of Multiview Video over ITU-T Rec H.222.0 | ISO/IEC 13818-1 "Text of ISO/IEC 13818-1:2007/FPDAM 4—Transport of Multiview Video over ITU-T Rec H.222.0 | ISO/IEC 13818-1," Lausanne, Switzerland, 2009, 21 pp.
International Search Report and Written Opinion—PCT/US2010/046027, ISA/EPO—Aug. 17, 2011.
International Standard ISO/IEC 14496-12, Information Technology—Coding of audio-visual objects—Part 12: ISO base media file format, Third Edition, Oct. 15, 2008, 120 pp.
International Telecommunication Union, "ITU-T H.264, Series H: Audiovisual and Multimedia Systems, Infrastructure of audiovisual services—Coding of moving video, Advanced video coding for generic audiovisual services," Mar. 2010, 669 pp.
ISO/IEC 13818-1, "Information technology-Generic coding of moving pictures and associated audio information: Systems," Second edition, Dec. 1, 2000, 174 pp.
ISO/IEC JTC 1/SC 29, ISO/IEC FCD 23001-6, Information technology—MPEG systems technologies—Part 6: Dynamic adaptive streaming over HTTP (DASH), Jan. 28, 2011.
"Joint Draft 8.0 on Multiview Video Coding", 28th JVT meeting, Hannover, Germany, Jul. 2008. available from http:// wftp3. itu.int/av-arch/jvt-site/2008_07_Hannover/JVT-AB204.
Juhn, L. et al.: "Adaptive Fast Data Broadcasting Scheme for Video-on-Demand Service," IEEE Transactions on Broadcasting, vol. 44, No. 2, pp. 182-185 (Jun. 1998).
Juhn, L. et al.: "Harmonic Broadcasting for Video-on-Demand Service," IEEE Transactions on Broadcasting, vol. 43, No. 3, pp. 268-271 (Sep. 1997).
Kallel, "Complementary Punctured Convolutional (CPC) Codes and Their Applications", IEEE Transactions on Communications, IEEE Inc., New York, US, Vol. 43, No. 6, 1 Jun. 1995, pp. 2005-2009.
Kimata H et al., "Inter-View Prediction With Downsampled Reference Pictures", ITU Study Group 16—Video Coding Experts Group—ISO/IEC MPEG & ITU-T VCEG(ISO/IEC JTC1/SC29/WG11 and ITU-T SG16 Q6), No. JVT-W079, Apr. 19, 2007, XP030007039.

(56) References Cited

OTHER PUBLICATIONS

Kozamernik F: "Media streaming over the Internet", Internet Citation, Oct. 2002, XP002266291, Retrieved from the Internet: URL: http://www.ebu.ch/trev_292-kozamerni k. pdf [retrieved on Jan. 8, 2004] section "Video codecs for scalable streaming".
Lin, S. et al.: "Error Control Coding—Fundamentals and Applications," 1983, Englewood Cliffs, pp. 288, XP002305226.
Luby Digital Fountain A Shokrollahi Epfl M Watson Digital Fountain T Stockhammer Nomor Research M: "Raptor Forward Error Correction Scheme for Object Delivery; rfc5053.txt", IETF Standard, Internet Engineering Task Force, IETF, Ch, Oct. 1, 2007, XP015055125, ISSN: 0000-0003.
Luby, et al., "Analysis of Low Density Codes and Improved Designs Using Irregular Graphs", 1998, Proceedings of the 30TH Annual ACM Symposium on Theory of Computing, May 23, 1998, pp. 249-258, XP000970907.
Luby et al., "Improved Low-Density Parity-Check Codes Using Irregular Graphs and Belief Propogation", Information Theory, 1998. Proceedings. 1998 IEEE International Symposium on Cambridge, MA, USA Aug. 16-21, 1998, New York, NY, USA, IEEE, US Aug. 16, 199.
Luby, et al.: "Analysis of Low Density Codes and Improved Designs Using Irregular Graphs," International Computer Science Institute Technical Report TR-97-045 (Nov. 1997) [available at ftp://ftp.icsi.berkeley.edu/pub/techreports/1997/tr-97-045.pdf].
Luby, M. et al.: "Efficient Erasure Correction Codes," 2001, IEEE Transactions on Information Theory, Vo. 47, No. 2, pp. 569-584, XP002305225.
Luby, M. et al.: "Practical Loss-Resilient Codes: Tornado Codes," 29th Annual ACM Symposium on Theory of Computing, vol. SYMP. 29, May 4, 1997, pp. 1-10, XP002271229.
Luby, Michael G. "Analysis of Random Processes via And-Or Tree Evaluation," Proceedings of the 9th Annual ACM-SIAM Symposium on Discrete Algorithms,TR-97-0, 1998, pp. 364-373, (search date: Jan. 25, 2010) URL: <http://portal.acm.prg.citation.cfm?id=314722>.
Marpe, et al., "The H.264/MPEG4 Advanced Video Coding Standard and its Applications," Standards Report, IEEE Communications Magazine, Aug. 2006, pp. 134-143.
Min-Goo Kim: "On systematic punctured convolutional codes", IEEE Trans on Communications, vol. 45, No. 2, Feb. 1997, XP002628272, the whole document, pp. 133-139.
Muller, et al., "A test-bed for the dynamic adaptive streaming over HTTP featuring session mobility" MMSys '11 Proceedings of the second annual ACM conference on Multimedia systems, Feb. 23-25, 2011, San Jose, CA, pp. 271-276.
Naguib, Ayman, et al., "Applications of Space-Time Block Codes and Interference Suppression for High Capacity and High Data Rate Wireless Systems," IEEE, 1998, pp. 1803-1810.
Narayanan, et al., "Physical Layer Design for Packet Data Over IS-136", Vehicular Technology Conference, 1997, IEEE 47TH Phoenix, AZ, USA May 4-7, 1997, New York, NY, USA, IEEE, US May 4, 1997, pp. 1029-1033.
Nonnenmacher, et al., "Parity-Based Loss Recovery for Reliable Multicast Transmission", IEEE / ACM Transactions on Networking, IEEE Inc. New York, US, Vol. 6, No. 4, Aug. 1, 1998, pp. 349-361.
Ozden, B. et al.: "A Low-Cost Storage Service for Movie on Demand Databases," Proceedings of the 20th Very Large DataBases (VLDB) Conference, Santiago, Chile (1994).
PA. Chou, A. Mohr, A. Wang, S. Mehrotra, "FEC and Pseudo-ARQ for Receiver-Driven Layered Multicast of Audio and Video," pp. 440-449, IEEE Computer Society, Data Compression Conference (2000).
Pantos R et al., "HTTP Live Streaming; draft-pantos-http-1ive-streaming-OT.txt ", HTTP Live Streaming; Draft-Pant0s-HTTP-Live-Streaming-01.TXT, Internet Engineering Task Force, IETF; Standardworkingdraft, Internet Society (ISOC) 4, Rue Des Falaises CH—1205 Geneva, Switzerland, No. 1, Jun. 8, 2009, XP015062692.

Paris, et al., "A low bandwidth broadcasting protocol for video on demand", Proc. International Conference on Computer Communications and Networks, vol. 7, pp. 690-697 (Oct. 1998).
Paris, et al., "Efficient broadcasting protocols for video on demand", International Symposium on Modeling, Analysis and Simulation of Computer and Telecommunication systems (MASCOTS), vol. 6, pp. 127-132 (Jul. 1998).
Perkins, et al.: "Survey of Packet Loss Recovery Techniques for Streaming Audio," IEEE Network; Sep./Oct. 1998, pp. 40-48.
Petition decision for Petition Under 37 C.F.R. § 1.78 to Accept an Unintentionally Delayed Priority Claim under 35 U.S.C. § 120 in U.S. Patent No. 7,532,132, dated Jul. 21, 2011, 2 pages.
Petition under 37 C.F.R. § 1.78 to Accept an Unintentionally Delayed Priority Claim under 35 U.S.C. § 120 in U.S. Patent No. 7,532,132 , dated May 27, 2011, 2 pages.
Plank J. S., "A Tutorial on Reed-Solomon Coding for Fault-Tolerance in Raid-Like Systems", Software Practice & Experience, Wiley & Sons, Bognor Regis, GB, vol. 27, No. 9, Sep. 1, 1997, pp. 995-1012, XP00069594.
Pless and WC Huffman EDS V S: Algebraic geometry codes, Handbook of Coding Theory, 1998, pp. 871-961, XP002300927.
Pursley, et al.: "Variable-Rate Coding for Meteor-Burst Communications," IEEE Transactions on Communications, US, IEEE Inc. New York (1989) vol. 37, No. 11, pp. 1105-1112 XP000074533.
Pursley, M. et al.: "A Correction and an Addendum for Variable-Rate Coding for Meteor-Burst Communications," IEEE Transactions on Communications, vol. 43, No. 12 pp. 2866-2867 (Dec. 1995).
Pyle et al., "Microsoft Http Smooth Streaming: Microsoft response to the Call for Proposal on HTTP Streaming", 93 MPEG Meeting; Jul. 26-30, 2010; Geneva; (Motion Picture Expert Group or ISO/IEC JTC1/SCE29/WG11), No. M17902, Jul. 22, 2010, XP030046492.
QUALCOMM Europe S A R L: "Baseline Architecture and Definitions for HTTP Streaming", 3GPP Draft; S4-090603_HTTP_ Streaming_Architecture, 3RD Generation Partnership Project (3GPP), Mobile Competence Centre; 650, Route Des Lucioles; F-06921 Sophia-Antipolis Cedex; France, No. Kista; Aug. 12, 2009, XP050356889.
QUALCOMM Incorporated: "Use Cases and Examples for Adaptive HTTP Streaming", 3GPP Draft; S4-100408-Usecases-HSD, 3RD Generation Partnership Project (JGPP), Mobile Competence Centre; 650, Route Des Lucioles; F-06921 Sophia-Antipolis Cedex; France, vol. SA WG4, No. Prague, Czech Republic; Jun. 17, 2010, XP050438085, [retrieved on Jun. 17, 2010].
Rangan, et al., "Designing an On-Demand Multimedia Service," IEEE Communication Magazine, vol. 30, pp. 56-64, (Jul. 1992).
Realnetworks Inc et al., "Format for HTTP Streaming Media Presentation Description", 3GPP Draft; S4-100020, 3RD Generation Partnership Project (3GPP), Mobile Competence Centre; 650, Route Des Lucioles; F-06921 Sophia-Antipolis Cedex; France, vol. SA WG4, No. S t Julians, Malta; Jan. 20, 2010, XP050437753, [retrieved on Jan. 20, 2010].
Research in Motion UK Limited: "An MPD delta file for HTTP Streaming", 3GPP Draft; S4-100453, 3RD Generation Partnership Project (SGPP), Mobile Competence Centre; 650, Route Des Lucioles; F-06921 Sophia-Antipolis Cedex; France, vol. SA WG4, No. Prague, Czech Republic; Jun. 16, 2010, XP050438066, [retrieved on Jun. 16, 2010].
Rhyu et al., "Response to Call for Proposals on HTTP Streaming of MPEG Media", 93 MPEG Meeting; Jul. 26-30, 2010; Geneva; (Motion Picture Expert Group or ISO/IEC JTC1/SCE29/WG11) No. M17779, Jul. 26, 2010, XP030046369.
Rizzo, L. "Effective Erasure Codes for Reliable Computer Communication Protocols," Computer Communication Review, 27 (2) pp. 24-36 (Apr. 1, 1997), XP000696916.
Roca, V. et al.: "Design, Evaluation and Comparison of Four Large Block FEC Codecs, LDPC, LDGM, LDGM Staircase and LDGM Triangle, plus a Reed-Solomon Small Block FEC Codec," INRIA Research Report RR-5225 (2004).
Rost, S. et al.: "The Cyclone Server Architecture: streamlining delivery of popular content," 2002, Computer Communications, vol. 25, No. 4, pp. 403-412.

(56) References Cited

OTHER PUBLICATIONS

Roth, R., et al., "A Construction of Non-Reed-Solomon Type MDS Codes", IEEE Transactions of Information Theory, vol. 35, No. 3, May 1989, pp. 655-657.
Roth, R., "On MDS Codes via Cauchy Matrices", IEEE Transactions on Information Theory, vol. 35, No. 6, Nov. 1989, pp. 1314-1319.
Schwarz, Heiko et al., "Overview of the Scalable Video Coding Extension of the H.264/AVC Standard", IEEE Transactions on Circuits and Systems for Video Technology, vol. 17, No. 9, Sep. 2007, pp. 1103-1120.
Seshan, S. et al.: "Handoffs in Cellular Wireless Networks: The Daedalus Implementation and Experience," Wireless Personal Communications, NL; Kluwer Academic Publishers, vol. 4, No. 2 (Mar. 1, 1997) pp. 141-162, XP000728589.
Shacham: "Packet Recovery and Error Correction in High-Speed Wide-Area Networks," Proceedings of the Military Communications Conference. (Milcom), US, New York, IEEE, vol. 1, pp. 551-557 (1989) XP000131876.
Shierl T; Gruneberg K; Narasimhan S; Vetro A: "ISO/IEC 13818-1:2007/FPDAM 4—Information Technology Generic Coding of Moving Pictures and Audio Systems amendment 4: Transport of Multiview Video over ITU-T Rec H.222.0 ISO/IEC 13818-1" ITU-T Rec. H.222.0(May 2006)FPDAM 4, vol. MPEG2009, No. 10572, May 11, 2009, pp. 1-20, XP002605067 p. 11, last two paragraphs sections 2.6.78 and 2.6.79 table T-1.
Shokrollahi, A.: "Raptor Codes," Internet Citation [Online] (Jan. 13, 2004) XP002367883, Retrieved from the Internet: URL:http://www.cs.huji.ac.il/labs/danss/p2p/resources/raptor.pdf.
Shokrollahi, Amin. "Raptor Codes," IEEE Transactions on Information Theory, Jun. 2006, vol. 52, No. 6, pp. 2551-2567, (search date: Feb. 1, 2010) URL: <http://portal.acm.org/citation.cfm?id=1148681>.
Shokrollahi et al., "Design of Efficient Easure Codes with Differential Evolution", IEEE International Symposium on Information Theory, Jun. 25, 2000, pp. 5-5.
Sincoskie, W. D., "System Architecture for Large Scale Video on Demand Service," Computer Network and ISDN Systems, pp. 155-162, (1991).
Stockhammer, "WD 0.1 of 23001-6 Dynamic Adaptive Streaming over HTTP (DASH)", MPEG-4 Systems, International Organisation for Standardisation, ISO/IEC JTC1/SC29/WG11, Coding of Moving Pictures and Audio, MPEG 2010 Geneva/m11398, Jan. 6, 2011, 16 pp.
Sullivan et al., Document: JVT-AA007, "Editors' Draft Revision to ITU-T Rec. H.264|ISO/IEC 14496-10 Advanced Video Coding—In Preparation for ITU-T SG 16 AAP Consent (in integrated form)," Joint Video Team (JVT) of ISO/IEC MPEG & ITU-T VCEG (ISO/IEC JTC1/SC29/WG11 and ITU-T SG16 Q.6), 30th Meeting: Geneva, CH, Jan. 29-Feb. 3, 2009, pp. 1-683, http://wftp3.itu.int/av-arch/jvt-site/2009_01_Geneva/JVT-AD007.zip.
Sun, et al., "Seamless Switching of Scalable Video Bitstreams for Efficient Streaming," IEEE Transactions on Multimedia, vol. 6, No. 2, Apr. 2004, pp. 291-303.
Telefon AB LM Ericsson et al., "Media Presentation Description in HTTP Streaming", 3GPP Draft; S4-100080-MPD, 3RD Generation Partnership Project (3GPP), Mobile Competence Centre; 650, Route Des Lucioles; F- 06921 Sophia-Antipolis Cedex; France, vol. SA WG4, No. St Julians, Malta; Jan. 20, 2010, XP050437773, [retrieved on Jan. 20, 2010].
Thomas Wiegand, et al., "Joint Draft ITU-T Rec. H.264| ISO/IEC 14496-10 / Amd.3 Scalable video coding", Joint Video Team (JVT) of ISO/IEC MPEG & ITU-T VCEG (ISO/IEC JTC1/SC29/WG11 and ITU-T SG16 Q.6) 24th Meeting: Geneva, Switzerland, Jun. 29-Jul. 5, 2007, pp. 1-559.
Vetro, et al., Document: JVT-AB204 (rev. 1), "Joint Draft 8.0 on Multiview Video Coding," Joint Video Team (JVT) of ISO/IEC MPEG & ITU-T VCEG(ISO/IEC JTC1/SC29/WG11 and ITU-T SG16 Q.6), 28th Meeting: Hannover, DE, Jul. 20-25, 2008, pp. 1-66, http://wftp3.itu.int/av-arch/jvt-site/2008_07_Hannover/JVT-AB204.zip.

Viswanathan, et al., "Metropolitan area video-on-demand services using pyramid broadcasting", Multimedia Systems, 4(4): 197-208 (1996).
Viswanathan, et al., "Pyramid Broadcasting for Video-on-Demand Service", Proceedings of the SPIE Multimedia Computing and Networking Conference, vol. 2417, pp. 66-77 (San Jose, CA, Feb. 1995).
Viswanathan,Subramaniyam R., "Publishing in Wireless and Wireline Environments," Ph. D Thesis, Rutgers, The State University of New Jersey (Nov. 1994), 180pages.
Wang,"On Random Access", Joint Video Team (JVT) of ISO/IEC MPEG & ITU-T VCEG (ISO/IEC JTC1ISC29/WG11 and ITU-T SG16 Q.6), 4th Meeting: Klagenfurt, Austria, Jul. 22-26, 2002, p. 13.
Wenger S., "RTP Payload Format for H.264 Video", Network Working Group, Feb. 2005, pp. 1-84.
Wong, J.W., "Broadcast delivery", Proceedings of the IEEE, 76(12): 1566-1577, (1988).
Yamauchi, Nagamasa. "Application of Lost Packet Recovery by Front Error Correction to Internet Multimedia Transfer" Proceedings of Workshop for Multimedia Communication and Distributed Processing, Japan, Information Processing Society of Japan (IPS), Dec. 6, 2000, vol. 2000, No. 15, pp. 145-150.
Yin et al., "Modified Belief-Propogation algorithm for Decoding of Irregular Low-Density Parity-Check Codes", Electronics Letters, IEE Stevenage, GB, vol. 38, No. 24, Nov. 21, 2002, pp. 1551-1553.
Ying Chen et al: "Response to the CfP on HTTP Streaming: Adaptive Video Streaming based on AVC", 93 MPEG Meeting; Jul. 26-30, 2010; Geneva; (Motion Picture Expert Group or ISO/IEC JTC1/SC29/WG11), No. M17909, Jul. 26, 2010, XP030046499.
Zorzi, et al.: "On the Statistics of Block Errors in Bursty Channels," IEEE Transactions on Communications, vol. 45, No. 6, Jun. 1997, pp. 660-667.
Albanese, A., et al., "Priority Encoding Transmission", IEEE Transactions on Information Theory, vol. 42, No. 6, pp. 1-22, (Nov. 1996).
Anonymous: "Text of ISO/IEC 14496-12:2008/PDAM 2 Sub-track selection & switching", 91. Mpeg Meeting; Jan. 18-22, 2010; Kyoto; (Motion Picture Expertgroup or ISO/IEC JTC1/SC29/WG11), No. N11137, Jan. 22, 2010, XP030017634, ISSN: 0000-0030.
Byers, J.W. et al.: "Accessing multiple mirror sites in parallel: using Tornado codes to speed up downloads," 1999, Eighteenth Annual Joint Conference of the IEEE Comupter and Communications Socities, pp. 275-283, Mar. 21, 1999, XP000868811.
Choi S: "Temporally enhanced erasure codes for reliable communication protocols" Computer Networks, Elsevier Science Publishers B.V., Amsterdam, NL, vol . 38, No. 6, Apr. 22, 2002, pp. 713-730, XP004345778, ISSN: 1389-1286, DOI:10.1016/S1389-1286(01)00280-8.
D. Gozalvez et,al. "AL-FEC for Improved Mobile Reception of MPEG-2 DVB-Transport Streams" Hindawi Publishing Corporation, International Journal of Digital Multimedia Broadcasting vol. 2009, Dec. 31, 2009, pp. 1-10, XP002582035 Retrieved from the Internet: URL:http://www.hindawi.com/journals/ijdmb/2009/614178.html> [retrieved on May 12, 2010].
"Digital Video Broadcasting (DVB); Guidelines for the implementation of DVB-IP Phase 1 specifications; ETSI TS 102 542" ETSI Standards, LIS, Sophia Antipoliscedex, France, vol. BC, No. V1.2.1, Apr. 1, 2008, XP014041619 ISSN: 0000-0001 p. 43 p. 66 pp. 70, 71.
DVB-IPI Standard: DVB Blue Book A086r4 (Mar. 2007) Transport of MPEG 2 Transport Streatm (TS) Based DVB Services over IP Based Networks, ETSI Technical Specification 102 034 v1.3.1.
Gasiba, Tiago et al., "System Design and Advanced Receiver Techniques for MBMS Broadcast Services" Proc. 2006 International Conference on Communications (ICC 2006), Jun. 1, 2006, pp. 5444-5450, XP031025781 ISBN: 978-1-4244-0354-7.
Goyal: "Multiple Description Coding: Compression Meets the Network," In Signal Processing Magazine, IEEE, vol. 18., Issue 5 (Sep. 2001) pp. 74-93 URL:http://www.rle.mit.edu/stir/documents/Goyal_SigProcMag2001_MD.pdf [Nov. 4, 2007].
Gozalvez D et, al: "Mobile reception of DVB-T services by means of AL-FEC protection" Proc. IEEE Intern. Symposium on Broadband Multimedia Systems and Broadcasting (BMSB '09), IEEE, Piscataway, NJ, USA, May 13, 2009, pp. 1-5, XP031480155 ISBN: 978-1-4244-2590-7.

(56) References Cited

OTHER PUBLICATIONS

IETF RFC 2733: Rosenberg, J. et al. "An RTP Payload Format for Generic Forward Error Correction," Network Working Group, RFC 2733 (Dec. 1999).
International Search Report and Written Opinion—PCT/US2011/044745—ISA/EPO—Dec. 12, 2011.
ISO/IEC JTC1/SC29/WG11: "Requirements on HTTP Streaming of MPEG Media", 92. MPEG Meeting; Apr. 19-23, 2010; Dresden; No. N11340, May 14, 2010, XP030017837, ISSN: 0000-0029.
Jin Li, "The Efficient Implementation of Reed-Solomon High Rate Erasure Resilient Codes" Proc. 2005 IEEE International Conference on Acoustics, Speech, and Signal Processing, Philadelphia, PA, USA, IEEE, Piscataway, NJ, vol . 3, Mar. 18, 2005, pp. 1097-1100, XP010792442, DOI: 10.1109/ICASSP.2005.1415905 ISBN: 978-0-7803-8874-1.
Lee L., et al.,"VLSI implementation for low density parity check decoder", Proceedings of the 8th IEEE International Conference on Elecctronics, Circuits and Systems, 2001. ICECS 2001, Sep. 2, 2001, vol. 3, pp. 1223-1226.
Luby, et al., "Flute-File Delivery over Unidirectional Transport", IETF RFC 3926, pp. 1-35, (Oct. 2004).
Luby et, al. "Layered Coding Transport (LCT) Building Block", IETF RFC 5651, pp. 1-42, (Oct. 2009).
Luby, M., et al. "Forward Error Correction (FEC) Building Block", IETF RFC 5052, pp. 1-31, (Aug. 2007).
Luby, M., et al., "Raptor Forward Error Correction Scheme for Object Delivery", IETF RFC5053, pp. 1-46 (Sep. 2007).
Luby, M., et al., "RaptorQ Forward Error Correction Scheme for Object Delivery", IETF draft ietf-rmt-bb-fec-raptorq-04, Reliable Multicast Transport, pp. 1-68, (Aug. 24, 2010).
Luby, M., et al., "Request for Comments: 3453: The Use of Forward Error Correction (FEC) in Reliable Multicast," Internet Article, [Online] Dec. 2002, pp. 1-19.
Luby M et al: "IPTV Systems, Standards and Architectures: Part II—Application Layer FEC in IPTV Services" IEEE Communications Magazine, IEEE Service Center, Piscataway, US LNKDDOI: 10.1109/MCOM.2008.4511656, vol. 46, No. 5, May 1, 2008, pp. 94-101, XP011226858 ISSN: 0163-6804.
Luby, M. et al.: "Pairwise Independence and Derandomization," Foundations and Trends in Theoretical Computer Science, vol. 1, Issue 4, 2005, Print ISSN 1551-305X, Online ISSN 1551-3068.
Matsuoka H., et al., "Low-Density Parity-Check Code Extensions Applied for Broadcast-Communication Integrated Content Delivery", Research Laboratories, NTT DOCOMO, Inc., 3-6, Hikari-No-Oka, Yokosuka, Kanagawa, 239-8536, Japan, ITC-SS21, 2010 IEICE, pp. 59-63.
McCanne, et al., "Low-Complexity Video Coding for Receiver-Driven Layered Multicast", IEEE Journal on Selected Areas in Communication IEEE Service Center, Aug. 1, 1997, vol. 15, No. 6, pp. 983-1001, Piscataway, US, XP011054678, ISSN: 0733-8716.
Mimnaugh, A et, al. "Enabling Mobile Coverage for DVB-T" Digital Fountain Whitepaper Jan. 29, 2008, pp. 1-9, XP002581808 Retrieved from the Internet: URL:http://www.digitalfountain.com/ufiles/library/DVB-T-whitepaper.pdf> [retrieved on May 10, 2010].
Nokia: "Reed-Solomon Code Specification for. MBMS Download and Streaming Services", 3GPP Draft; S4-050265_RS_SPEC,3RD Generation Partnership Project (3GPP), Mobile Competence Centre ; 650, Route Des Lucioles ; F-06921 Sophia-Antipolis Cedex ; France, vol. SA WG4, No. San Diego, USA; Apr. 15, 2005, XP050287675, [retrieved on Apr. 15, 2005].
Nokia Corp., "Usage of 'mfra' box for Random Access and Seeking," S4-AHI127, 3GPP TSG-SA4 Ad-Hoc Meeting, Dec. 14-16, 2009, Paris, FR, 2 pp.
Roca, V., et, al. "Low Density Parity Check (LDPC) Staircase and Triangle Forward Error Correction (FEC) Schemes", IETF RFC 5170 (Jun. 2008), pp. 1-34.
Tsunoda T., et al., "Reliable Streaming Contents Delivery by Using Multiple Paths," Technical Report of the Institute of Electronics, Information and Communication Engineers, Japan, Mar. 2004, vol. 103, No. 692, pp. 187-190, NS2003-331, IN2003-286.

U.S. Appl. No. 12/840,146, by Ying Chen et al., filed Jul. 20, 2010.
U.S. Appl. No. 12/908,537, by Ying Chen et al., filed Oct. 20, 2010.
U.S. Appl. No. 12/908,593, by Ying Chen et al., filed Oct. 20, 2010.
U.S. Appl. No. 13/082,051, by Ying Chen et al., filed Apr. 7, 2011.
U.S. Appl. No. 13/205,559, by Ying Chen et al., filed Aug. 8 2011.
U.S. Appl. No. 13/205,565, by Ying Chen et al., filed Aug. 8, 2011.
U.S. Appl. No. 13/205,574, by Ying Chen et al., filed Aug. 8, 2011.
Universal Mobile Telecommunications System (UMTS); LTE; Transparent end-to-end Packet-switched Streaming Service (PSS); Protocols and codecs (3GPP TS 26.234 version 9.3.0 Release 9), Technical Specification, European Telecommunications Standards Institute (ETSI), 650, Route Des Lucioles; F-06921 Sophia-Antipolis; France, vol. 3GPP SA, No. V9.3.0, Jun. 1, 2010, XP014047290, paragraphs [5.5.4.2], [5.5.4.3], [5.5.4.4], [5.4.5], [5.5.4.6] paragraphs [10.2.3], [11.2.7], [12.2.3], [12.4.2], [12.6.2] paragraphs [12.6.3], [12.6.3.1], [12.6.4], [12.6.6].
Watson, M., et, al. "Asynchronous Layered Coding (ALC) Protocol Instantiation", IETF RFC 5775, pp. 1-23, (Apr. 2010).
Cataldi et al., "Sliding-Window Raptor Codes for Efficient Scalable Wireless Video Broadcasting With Unequal Loss Protection", IEEE Transactions on Image Processing, Jun. 1, 2010, pp. 1491-1503, vol. 19, No. 6, IEEE Service Center, XP011328559, ISSN: 1057-7149, DOI: 10.1109/TIP.2010.2042985.
Gracie et al., "Turbo and Turbo-Like Codes: Principles and Applications in Telecommunications", Proceedings of the IEEE, Jun. 1, 2007, pp. 1228-1254, vol. 95, No. 6, IEEE, XP011189323, ISSN: 0018-9219, DOI: 10.1109/JPROC.2007.895197.
Huawei et al., "Implict mapping between CCE and PUCCH for ACK/NACK TDD", 3GPP Draft; R1-082359, 3rd Generation Partnership Project (3GPP), Mobile Competence Centre; 650, Route Des Lucioles; F-06921 Sophia-Antipolis Cedex; France, vol. RAN WG1, No. Warsaw, Poland, Jun. 24, 2008, XP050110650, [retrieved on Jun. 24, 2008].
International Search Report and Written Opinion—PCT/US2012/024737—ISA/EPO—May 11, 2012).
Kimura et al., "A Highly Mobile SDM-OFDM System Using Reduced-Complexity-and- Processing", IEEE International Symposium on Personal, Indoor and Mobile Radio Communications (PIMRC), Sep. 1, 2007, pp. 1-5, IEEE, XP031168836, ISBN: 978-1-4244-1143-6, DOI: 10.1109/PIMRC.2007.4394758.
Luby Qualcomm Incorporated, "Universal Object Delivery using RaptorQ; draft-luby-uod-raptorq-OO.txt", Internet Engineering Task Force (IETF), Standardworkingdraft, Internet Society (ISOC), Mar. 7, 2011, pp. 1-10, XP015074424, [retrieved on Mar. 7, 2011].
Mackay, "Fountain codes Capacity approaching codes design and implementation", IEE Proceedings: Communications, Dec. 9, 2005, pp. 1062-1068, vol. 152, No. 6, Institution of Electrical Engineers, XP006025749, ISSN: 1350-2425, DOI: 10.1049/IP-COM:20050237.
Todd, "Error Correction Coding: Mathematical Methods and Algorithms", Mathematical Methods and Algorithms, Jan. 1, 2005, pp. 451-534, Wiley, XP002618913.
Bross, et al., "High efficiency video coding (HEVC) text specification draft 6," Joint Collaborative Team on Video Coding (JCT-VC) of ITU-T SG16 WP3 and ISO/IEC JTC1/SC29/WG11 JCTVC-H1003, 7th Meeting: Geneva, CH, Nov. 21-30, 2011, pp. 259.
Bross, et al., "High efficiency video coding (HEVC) text specification draft 7," Joint Collaborative Team on Video Coding (JCT-VC) of ITU-T SG16 WP3 and ISO/IEC JTC1/SC29/WG11 9th Meeting: Geneva, CH, Apr. 27-May 7, 2012, JCTVC-I1003_d21, pp. 290.
Bross, et al., "High efficiency video coding (HEVC) text specification draft 8," Joint Collaborative Team on Video Coding (JCT-VC) of ITU-T SG16 WP3 and ISO/IEC JTC1/SC29/WG11 10th Meeting: Stockholm, SE, Jul. 11-20, 2012, JCTVC-J1003_d7, pp. 261.
Bross et al., "WD4: Working Draft 4 of High-Efficiency Video Coding," JCTVC-F803_d2, (JCT-VC) of ITU-T SG16 WP3 and ISO/IEC JTC1/SC29/WG11 Joint Collaborative Team on Video Coding, 6th Meeting, Torino, IT, Jul. 14-22, 2011, 226 pages.
Bross et al., "WD5: Working Draft 5 of High-Efficiency Video Coding," JCTVC-G1103_d2, (JCT-VC) of ITU-T SG16 WP3 and ISO/IEC JTC1/SC29/WG11 Joint Collaborative Team on Video Coding, 7th Meeting, Geneva, Switzerland (Nov. 2011), 214 pages.

(56) References Cited

OTHER PUBLICATIONS

European Search Report—EP10013235—Search Authority—The Hague—Aug. 20, 2012.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Jiang., File Format for Scalable Video Coding, PowerPoint Presentation for CMPT 820, Summer 2008.
Pantos, "HTTP Live Streaming draft-pantos-http-live-streaming-02", Informational, Internet-Draft, Intended status: Informational, Expires: Apr. 8, 2010, http://tools.ietf.org/html/draft-pantos-http-live-streaming-02, pp. 1-20, Oct. 5, 2009.
Thomas Wiegand et al.," WD1: Working Draft 1 of High-Efficiency Video Coding", JCTVC-C403, Joint Collaborative Team on Video Coding (JCT-VC), of ITU-T SG16 WP3 and ISO/IEC JTC1/SC29/WG11, 3rd Meeting: Guangzhou, CN, Oct. 7-15, 2010.
Wiegand et al., "WD3: Working Draft 3 of High-Efficiency Video Coding," Document JCTVC-E603, 5th Meeting: Geneva, CH, Mar. 16-23, 2011,193 pp.
Wiegand T. et al., "WD2: Working Draft 2 of High-Efficiency Video Coding", 20110128, No. JCTVC D503, Jan. 28, 2011, XP002679642, Retrieved from the Internet: URL: http://wftp3.itu.int/av-archictvc-site/2011_01_D_Daegu/ [retrieved on Jul. 12, 2012].
Yamanouchi N., et al., "Internet Multimedia Transmission with Packet by Using Forward Error Correction," Proceedings of DPS Workshop, The Information Processing Society of Japan, Dec. 6, 2000, vol. 2000, No. 15, pp. 145-150.
Anonymous: "Technologies under Consideration", 100. MPEG Meeting;Apr. 30, 2012-May 5, 2012; Geneva; (Motion Picture Expert Group or ISO/IEC JTC1/SC29/WG11), No. N12682, Jun. 7, 2012, XP030019156.
Hannuksela M.M., et al., "DASH: Indication of Subsegments Starting with SAP", 97. MPEG Meeting; Jul. 18, 2011-Jul. 22, 2011; Torino; (Motion Picture Expert Group or ISO/IEC JTC1/SC29/WG11) No. m21096, Jul. 21, 2011, XP030049659.
Hannuksela M.M., et al., "ISOBMFF: SAP definitions and 'sidx' box", 97. MPEG Meeting; Jul. 18, 2011-Jul. 22, 2011; Torino; (Motion Picture Expert Group or ISO/IEC JTC1/SC29/WG11) No. m21435, Jul. 22, 2011, XP030049998.
Stockhammer T., et al., "DASH: Improvements on Representation Access Points and related flags", 97. MPEG Meeting; Jul. 18, 2011-Jul. 22, 2011; Torino; (Motion Picture Expert Group or ISO/IEC JTC1/SC29/WG11) No. m20339, Jul. 24, 2011, XP030048903.
Yamazaki M., et al., "Multilevel Block Modulation Codes Construction of Generalized DFT," Technical Report of the Institute of Electronics, Information and Communication Engineers, Jan. 24, 1997, vol. 96, No. 494, pp. 19-24, IT96-50.
Gil A., et al., "Personalized Multimedia Touristic Services for Hybrid Broadcast/Broadband Mobile Receivers," IEEE Transactions on Consumer Electronics, 2010, vol. 56 (1), pp. 211-219.
Li, M., et al., "Playout Buffer and Rate Optimization for Streaming over IEEE 802.11 Wireless Networks", Aug. 2009, Worcester Polytechnic Institute, USA.
Michael G et al., "Improved low-density parity-check codes using irregular graphs", Information Theory, IEEE Transactions on, Feb. 2001,vol. 47, No. 2, pp. 585-598.
Ohashi a et al., "Low-Density Parity-Check (LDPC) Decoding of Quantized Data," Technical Report of the Institute of Electronics, Information and Communication Engineers, Aug. 23, 2002, vol. 102, No. 282, pp. 47-52, RCS2002-154.
Roumy A., et al., "Unequal Erasure Protection and Object Bundle Protection with the Generalized Object Encoding Approach", Inria-00612583, Version 1, Jul. 29, 2011, 25 pages.
Schulzrinne, et al., "Real Time Streaming Protocol (RTSP)" Network Working Group, Request for Comments: 2326, Apr. 1998, pp. 1-92.
Wadayama T, "Introduction to Low Density Parity Check Codes and Sum-Product Algorithm," Technical Report of the Institute of Electronics, Information and Communication Engineers, Dec. 6, 2001, vol. 101, No. 498, pp. 39-46, MR2001-83.
3GPP: "3rd Generation Partnership Project; Technical Specification Group Services and system Aspects; Multimedia Broadcast/Multicast Service (MBMS); Protocols and codecs (Release 6)", Sophia Antipolis, France, Jun. 1, 2005, XP002695256, Retrieved from the Internet: URL:http://www.etsi.org/deliver/ etsits1126300_126399/126346/06.01.00_60/ts_126346v060100p.pdf.
3rd Generation Partnership Project; Technical Specification Group Services and System Aspects; Transparent end-to-end Packet-switched Streaming Service (PSS); Progressive Download and Dynamic Adaptive Streaming over HTTP (3GP-DASH) (Release 10), 3GPP Standard; 3GPP TS 26.247, 3rd Generation Partnership Project (3GPP), Mobile Competence Centre; 650, Route Des Lucioles; F-06921 Sophia-Antipolis Cedex; France, vol. SA WG4, No. V10.0.0, Jun. 17, 2011, pp. 1-94, XP050553206, [retrieved on Jun. 17, 2011].
Anonymous: "Technologies under Consideration", 98. MPEG Meeting; Nov. 28, 2011-Feb. 12, 2011; Geneva; (Motion Picture Expert Group or ISO/IEC JTC1/SC29/WG11) No. N12330, Dec. 3, 2011, XP030018825.
Anonymous: "Text of ISO/IEC IS 23009-1 Media Presentation Description and Segment Formats", 98. MPEG Meeting; Nov. 28, 2011-Feb. 12, 2012; Geneva; (Motion Picture Expert Group or ISO/IEC JTC1/SC29/WG11) No. N12329, Jan. 6, 2012, XP030018824.
Atis: "PTV Content on Demand Service", IIF-WT-063R44, Nov. 11, 2010, pp. 1-124, XP055045168, Retrieved from the Internet: URL:ftp://vqeg.its.bldrdoc.gov/DocumentsNQEG_Atlanta_Nov10/MeetingFiles/Liaison/IIFWT-063R44_Content_on_Demand.pdf [retrieved on Nov. 22, 2012].
Bouazizi I., et al., "Proposals for ALC/FLUTE server file format (14496-12Amd.2)", 77. MPEG Meeting; Jul. 17, 2006-Jul. 21, 2006; Klagenfurt; (Motion Pictureexpert Group or ISO/IEC JTC1/SC29/WG11), No. M13675, Jul. 12, 2006, XP030042344, ISSN: 0000-0236.
"Digital Video Broadcasting (DVB); Framing structure, channel coding and modulation for digital terrestrial television; ETSI EN 300 744" ETSI Standards, LIS, Sophia Antipolis Cedex, France, V1.6.1, pp. 9, Jan. 10, 2009.
Frojdh P., et al., "Study on 14496-12:2005/PDAM2 ALU/ FLUTE Server File Format", 78.MPEG Meeting; Oct. 23, 2006-Oct. 27, 2006; Hangzhou: (Motion Picturexpert Group or ISO/IEC JTC1/SC29/WG11) No. M13855, Oct. 13, 2006, XP030042523, ISSN: 0000-0233.
Kim J., et al., "Enhanced Adaptive Modulation and Coding Schemes Based on Multiple Channel Reportings for Wireless Multicast Systems", 62nd IEEE Vehicular Technology Conference, Vtc-2005-Fall, Sep. 25-28, 2005, vol. 2, pp. 725-729, XP010878578, DOI: 1 0.11 09/VETECF.2005.1558019, ISBN: 978-0-7803-9152-9.
Luby et al., RaptorQ Forward Error Correction Scheme for Object Delivery draft-ietf-rmt-bb-fec-raptorq-00, Qualcomm, Inc. Jan. 28, 2010.
Moriyama, S., "5. Present Situation of Terrestrial Digital Broadcasting in Europe and USA", Journal of The Institute of Image Information and Television Engineers, Nov. 20, 1999, vol. 53, No. 11, pp. 1476-1478.
Motorola et al: "An Analysis of DCD Channel Mapping to BCAST File Delivery Sessions; OMA-CD-DCD-2007-0112-INP_DCD_Channel_Mapping_to_BCAST_File_Delivery", OMA-CD-DCD-2007-0112-INP_DCD_Channel_Mapping_To_BCAST_File_Deliver, Open Mobile Alliance (OMA), 4330 La Jolla Village Dr., Suite 110 San Diego, CA 92122; USA Oct. 2, 2007, pp. 1-13, XP064036903.
Bross, et al., "High efficiency video coding (HEVC) text specification draft 6," JCTVC-H1003, Joint Collaborative Team on Video Coding (JCT-VC) of ITU-T SG16 WP3 and ISO/IEC JCT1/SC29/WG11, 8th Meeting: San José, CA, USA, Feb. 1-10, 2012, 259 pp.
Makoto N., et al., "On Tuning of Blocking LU decomposition for VP2000 series" The 42th Information Processing Society of Japan Conference (1st term in 1991), Feb. 25, 1991, pp. 71-72, 4B-8.
Miller G., et al., "Bounds on the maximum likelihood decoding error probability of low density parity check codes", Information Theory, 2000. Proceedings. IEEE International Symposium on, 2000, p. 290.

(56) References Cited

OTHER PUBLICATIONS

Muramatsu J., et al., "Low density parity check matrices for coding of multiple access networks", Information Theory Workshop, 2003. Proceedings. 2003 IEEE, Apr. 4, 2003, pp. 304-307.

Qualcomm Incorporated: "RaptorQ Technical Overview", pp. 1-12, Oct. 1, 2010.

Samukawa, H. "Blocked Algorithm for LU Decomposition" Journal of the Information Processing Society of Japan, Mar. 15, 1993, Vol. 34, No. 3, pp. 398-408.

3GPP TSG-SA4 #57 S4-100015, IMS based PSS and MBMS User Service extensions, Jan. 19, 2010, URL: http://www.3gpp.org/ftp/tsg_sa/WG4_Codec/TSGS4_57/docs/S4-100015.zip.

3rd Generation Partnership Project; Technical Specification Group Services and System Aspects; Transparent end-to-end Packet-switched Streaming Service (PSS);Protocols and codecs(Release 9) 3GPP TS 26.234 V9.3.0, Jun. 23, 2010 P.85-102,URL,http://www.3gpp.org/ftp/TSG_SA/WG4_Codec/TSGS4_59/Docs/S4-100511.zip,.26234-930.zip.

Lee, J.Y., "Description of Evaluation Experiments on ISO/IEC 23001-6, Dynamic Adaptive.Streaming over HTTP", ISO/IEC JTC1/SC29/WG11MPEG2010/N11450, Jul. 31, 2010, 16 pp.

Luby M., "Simple Forward Error Correction (FEC) Schemes," draft-luby-rmt-bb-fec-suppsimple-00.txt, pp. 1-14, Jun. 2004.

Luby M., "LT Codes", Foundations of Computer Science, 2002, Proceedings, The 43rd Annual IEEE Symposium on, 2002.

Morioka S., "A Verification Methodology for Error Correction Circuits over Galois Fields", Tokyo Research Laboratory, IBM Japan Ltd, pp. 275-280, Apr. 22-23, 2002.

Qualcomm Incorporated: "Adaptive HTTP Streaming: Complete Proposal", 3GPP TSG-SA4 AHI Meeting S4-AHI170, Mar. 2, 2010, URL, http://www.3gpp.org/FTP/tsg_sa/WG4_CODEC/Ad-hoc MBS/Docs_AHI/S4-AHI170.zip, S4-AH170_CR_AdaptiveHTTPStreaming-Full.doc.

Qualcomm Incorporated: "Corrections to 3GPP Adaptive HTTP Streaming", 3GPP TSG-SA4 #59 Change Request 26.234 CR0172 S4-100403, Jun. 16, 2010, URL, http://www.3gpp.org/FTP/tsg_sa/WG4_CODEC/TSGS4_59/Docs/54-100403.zip, S4-100403_CR_26234-0172-AdaptiveHTTPStreaming-Rel-9.doc.

Chikara S., et al., "Add-on Download Scheme for Multicast Content Distribution Using LT Codes", IEICE. B, Communications, Aug. 1, 2006, J89-B (8), pp. 1379-1389.

Gerard F., et al., "HTTP Streaming MPEG media—Response to CFP", 93. MPEG Meeting, Geneva Jul. 26, 2010 to Jul. 30, 2010.

Hasan M A., et al., "Architecture for a Low Complexity Rate-Adaptive Reed-Solomon Encoder", IEEE Transactions on Computers, IEEE Service Center, Los Alamitos, CA, US, vol. 44, No. 7, Jul. 1, 1995, pp. 938-942, XP000525729, ISSN: 0018-9340, DOI: 10.1109/12.392853.

Tetsuo M., et al., "Comparison of Loss Resilient Ability between Multi-Stage and Reed-Solomon Coding ", Technical report of IEICE. CQ, Communication Quality, vol. 103 (178), Jul. 4, 2003, pp. 19-24.

Qualcomm Incorporated: "RatorQ Forward Error Correction Scheme for Object Delivery draft-ietf-rmt-bb-fec-raptorq-04", Internet Engineering Task Force, IETF, pp. 1-68, Aug. 24, 2010.

Watson M., et al., "Forward Error Correction (FEC) Framework draft-ietf-fecframe-framework11," 2011, pp. 1-38, URL,http://tools.ietf.org/pdf/draft-ietf-fecframe-framework-11.pdf.

Watson M., et al., "Raptor FEC Schemes for FECFRAME draft-ietf-fecframe-raptor-04," 2010, pp. 1-21, URL,http://tools.ietf.org/pdf/draft-ietf-fecframe-raptor-04.pdf.

Ramsey B, "HTTP Status: 206 Partial Content and Range Requests," May 5, 2008 obtained at http://benramsey.com/blog/2008/05/206-partial-content-and-range-requests/.

* cited by examiner

SYSTEMS AND PROCESSES FOR DECODING CHAIN REACTION CODES THROUGH INACTIVATION

CLAIM OF PRIORITY UNDER 35 U.S.C. §119 AND 35 U.S.C. §120

The present application claims the benefit of U.S. Provisional Application No. 61/235,285, filed Aug. 19, 2009, entitled "Methods and Apparatus Employing FEC Codes With Permanent Inactivation of Symbols for Encoding and Decoding Processes," and assigned to the assignee hereof and herein incorporated by reference for all purposes. The present application is a continuation-in-part of, and claims priority to, U.S. patent application Ser. No. 11/842,102, filed Aug. 20, 2007, now U.S. Pat. No. 7,633,413, issued Dec. 15, 2009, which is a continuation of U.S. patent application Ser. No. 11/356,303, filed Feb. 15, 2006, now U.S. Pat. No. 7,265,688, issued Sep. 4, 2007, which is a continuation of U.S. patent application Ser. No. 11/031,331, filed Jan. 7, 2005, now U.S. Pat. No. 7,030,785, issued Apr. 18, 2006, which is a continuation of U.S. patent application Ser. No. 10/459,370, filed Jun. 10, 2003, now U.S. Pat. No. 6,856,263, issued Feb. 15, 2005, which claims the benefit of U.S. Provisional Application No. 60/388,129, filed Jun. 11, 2002. U.S. Pat. No. 6,856,263 is incorporated by reference in its entirety for all purposes.

BACKGROUND OF THE INVENTION

The present invention relates to systems and methods for decoding data, and more particularly, to systems and methods for decoding information additive codes and multi-stage information additive codes, herein referred to collectively as "chain reaction codes."

Chain reaction codes have been described previously in the assignee's patents, such as U.S. Pat. No. 6,307,487 entitled "Information Additive Code Generator and Decoder for Communication Systems" (hereinafter "Luby I"), and U.S. patent application Ser. No. 10/032,156, entitled "Multi-Stage Code Generator and Decoder for Communication Systems" (hereinafter "Raptor"). As described therein, chain reaction decoding is a unique form of forward error-correction that enables data reconstruction from a received data set of a given size, without regard to the particular data packets received. Communication systems employing chain reaction codes are able to communicate information much more efficiently compared to traditional FEC codes transmitted via data carousel or acknowledgement-based protocols, as described in Luby I or Raptor.

FIG. 1 illustrates an exemplary process of encoding data using chain reaction codes in which an output symbol 170 is generated from several input symbols. The input symbols are denoted 110(a)-110(f). In some embodiments the first step of the coding process is static encoding, as described in Raptor. This step may produce the source symbols, denoted 120(a)-120(f), and 160(a)-160(c). In some embodiments, static encoding may be systematic, so that the values of the source symbols 120(a)-120(f) are equal to those of 110(a)-110(f). In some embodiments, there may be no static encoding, in which case the input symbols coincide with the source symbols.

Once the source symbols have been created, the output symbols are generated from the source symbols. Hereinafter, an output symbol and an input symbol are described as "associated" if the value of the input symbol is used to obtain the value of the output symbol. The mathematical operation which defines this association may be any particular operation, and in one embodiment, the output symbol's value is the XOR of the values of some of the source symbols. For each output symbol, key generator 140 produces a key, from which the weight of the output symbol is determined from a weight table 150. Once the weight W is determined, W random or pseudorandom source symbols are chosen, and the value of the output symbol is computed as the XOR of the values of these source symbols. For example, in FIG. 1, the weight of the output symbol 170 is equal to 3 and its value is determined as the XOR of the source symbols 120(a), 120(d), and 160(b). Correspondingly, output symbol 170 is associated to the source symbols 120(a), 120(d), and 160(b). Hereinafter, the term "degree" is used synonymously with "weight."

FIG. 2A illustrates a decoding graph used in the decoding of a chain reaction code. This decoding graph consists of two sets of symbols, the source symbols 220 (a)-(i), and the output symbols 230 (a)-(l). An output symbol is connected to a source symbol if the source and output symbols are "associated," as described above.

FIG. 2B illustrates a decoding matrix corresponding to the decoding graph of FIG. 2A which is useful in the decoding process. The decoding matrix 200 has as many rows as there are output symbols, as many columns as there are source symbols, and is populated with entries "0" and "1". A "1" is entered at position (k,j) of the decoding matrix if the $j^{th}$ source symbol is associated with the $k^{th}$ output symbol.

In a typical chain reaction decoding process, decoding starts by identifying an output symbol $O_1$ associated with a single source symbol. The term "output symbol of degree one" refers to the aforementioned output symbol associated with only one source symbol. Similarly, an output symbol associated with two source symbols would be referred to as an output symbol of "degree two." Source symbols are referred to in a similar manner corresponding to the number of output symbols each source symbol is associate with.

Once the output symbol $O_1$ of degree one is identified, the associated source symbol of $O_1$ is recovered and is removed from the decoding graph. The process continues by identifying another output symbol $O_2$ of degree one. For example, in the situation depicted in FIG. 2, $O_1$ could be the output symbol denoted 230(a). Once its associated source symbol 220(b), is removed from the Decoding Graph, there are three output symbols of degree one, namely 230(c), 230(d), and 230(k).

The process is continued until all the source symbols are recovered, or until there is no output symbol of degree one. For example, in the situation of FIG. 2, the following sequence of output symbols are chosen to recover the corresponding source symbols:

| Output symbol | Recovered source symbol |
| --- | --- |
| 230(a) | 220(b) |
| 230(c) | 220(e) |
| 230(h) | 220(h) |
| 230(d) | 220(i) |
| 230(i) | 220(d) |
| 230(b) | 220(a) |
| 230(j) | 220(f) |
| 230(g) | 220(g) |
| 230(e) | 220(c) |

In this case decoding is successful.

The foregoing chain reaction decoding process encounters difficulty when no output symbol of degree one is found. In some instances, the decoding process may stop prematurely and the decoder may flag an error. Alternatively, the decoder may use other more elaborate algorithms like Gaussian elimination to complete decoding, if possible. However, the running time of Gaussian elimination may be prohibitively large for applications where fast decoding is desired, especially when the number of unrecovered input symbols at the time when no more output symbols of degree one are found is large. This would lead to a decoding algorithm whose computational overhead is substantially larger than a chain reaction decoder, and may therefore be undesirable in certain applications.

For this reason, the design of chain reaction coding systems usually is done in such a way to guarantee that the decoder does not stop prematurely. This requirement may put stringent conditions on the design of the chain reaction code than may be possible using a more complex decoder. For example, it may enforce the average degree of an output symbol to be higher than otherwise, and thus may lead to a decrease in the performance of the encoder and of the decoder. More generally, this decoding procedure forces the design of the weight table to be in such a way as to guarantee the success of the abovementioned decoding algorithm with high probability, and hence may put restrictions on the set of possible weight tables.

What is therefore needed is a new decoding algorithm that offers similar computational advantages as the chain reaction decoder, and is able to continue decoding even if no output symbol of degree one is found at some stage of the decoding.

SUMMARY

The present invention provides systems and processes for decoding a chain reaction code, even when no output symbol of degree one is found in the code. This is accomplished in one embodiment by selecting a source symbol which is associated to an output symbol of degree two or higher (i.e., an output symbol which is itself associated with two or more input symbols). The source symbol associated with the output symbol of degree two or higher is then deactivated in an attempt to produce an output symbol of degree one. The inactivation process can be repeated either successively until an output symbol of degree one is identified, and/or whenever the decoding process is unable to locate an output symbol of degree one. Various embodiments of the processes and systems are presented herein.

Figure 1:
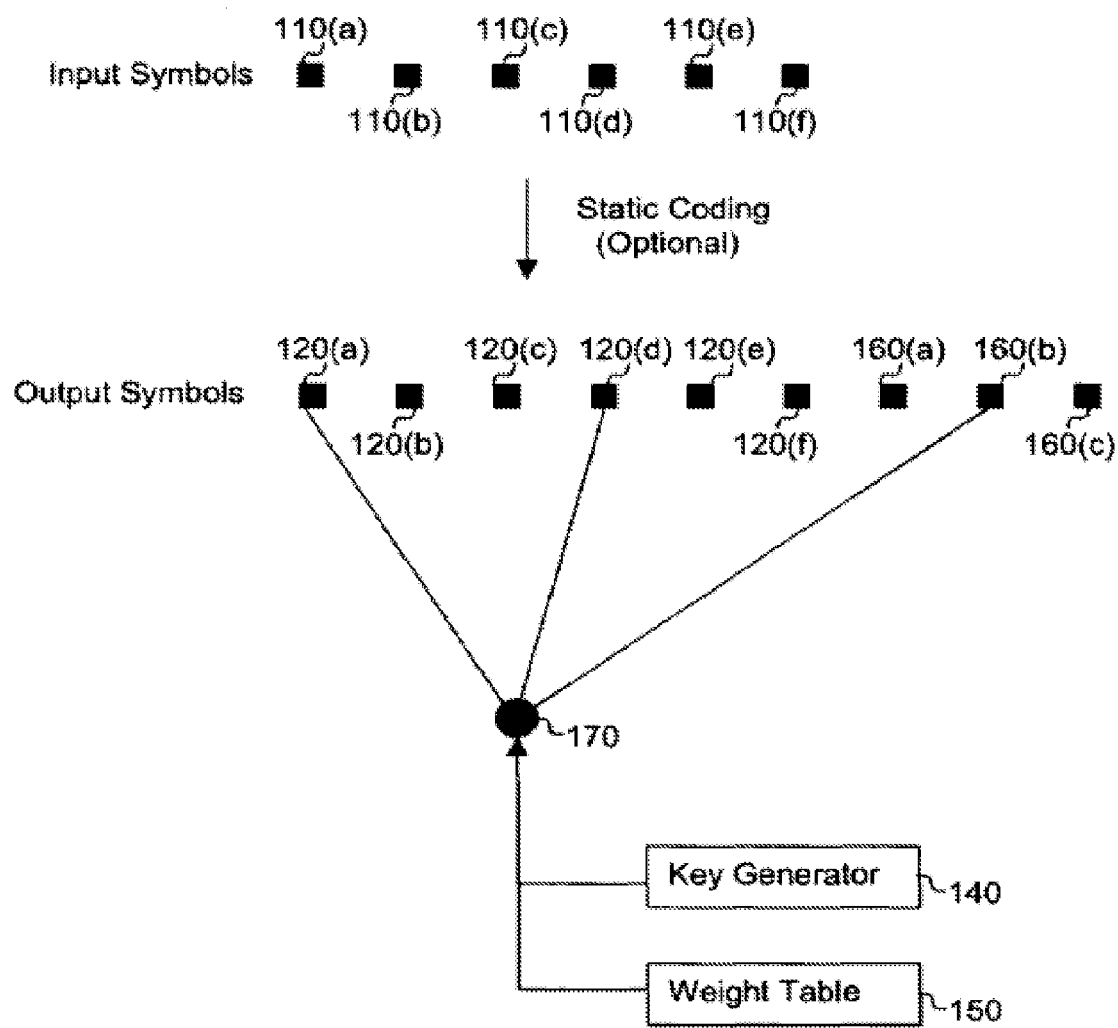
FIG. 1 illustrates an exemplary process of encoding data using chain reaction codes.

For clarity and convenience, features and components which are identified in earlier drawings retain their reference numerals in subsequent drawings.

DETAILED DESCRIPTION OF SOME EXEMPLARY EMBODIMENTS

The following terms are used throughout the application and are intended to have the indicated meaning:

The term "active" refers to a possible state of a source symbol. The active state of a source symbol is not permanent, and the active state of a source symbol may change to either an "inactive" state, a "recoverable state", or a "recovered" state as these terms are defined below.

The terms "deactivated" or "inactive" refers to another state of a source symbol. The state of a deactivated source symbol is not necessarily permanent, and an inactive source symbol may be reactivated in processes under the present invention.

The term "recoverable" refers to yet another state of a source symbol indicating that the value of the source symbol can be recovered if the values of some other source symbols are recovered. In a particular embodiment of the invention, a source symbol may become "recoverable" through the inactivation of one or more source symbols.

The term "recovered source symbol" refers to a source symbol whose values has been determined. The value of a source symbol may be determined either directly, e.g., from the value of an output symbol to which is singly associated therewith, or indirectly, e.g., from the value of a deactivated source symbol.

Figure 3:
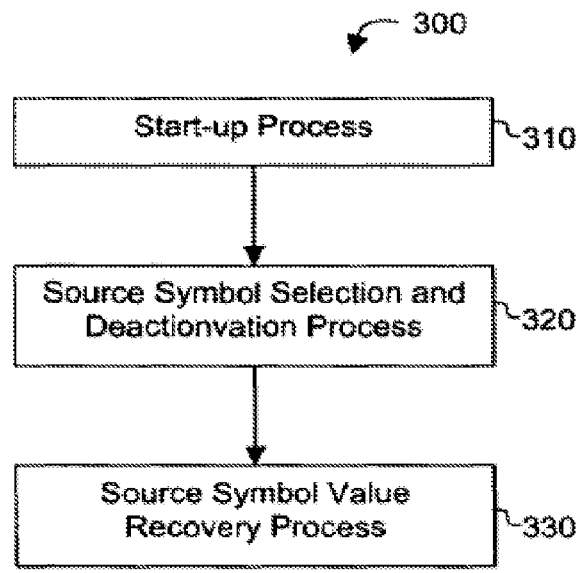
FIG. 3 illustrates an overview of the processes used to decode chain reaction codes in accordance with one embodiment of the present invention.

FIG. 3 illustrates an overview of the processes used to decode chain reaction codes in accordance with one embodiment of the present invention. The processes included in the exemplary decoding routine 300 include a start-up process 310, a source symbol selection and deactivation process 320, and a source symbol value recovery process 330.

Figure 4A:
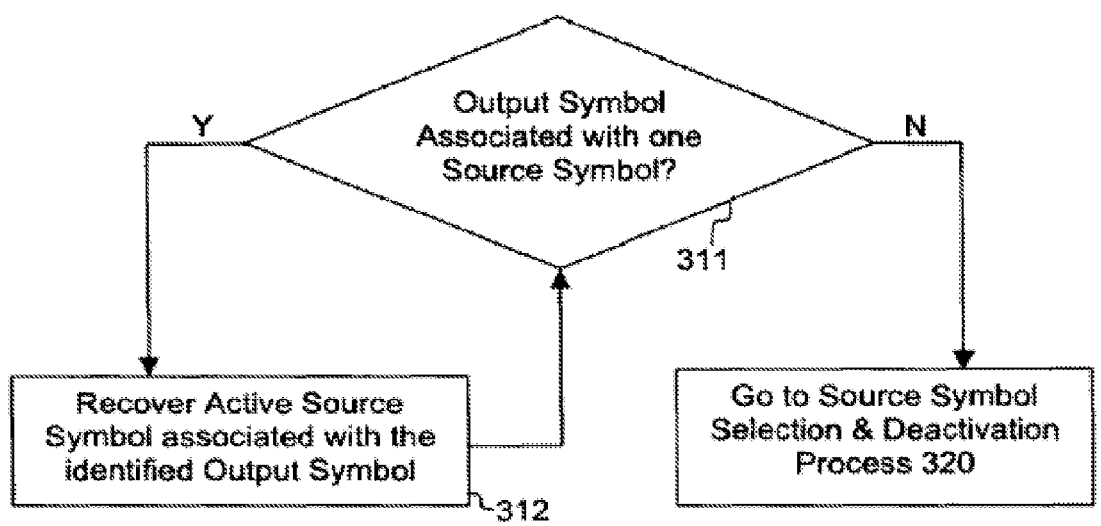
FIG. 4A illustrates a first embodiment of the start-up process shown in FIG. 3.

FIG. 4A illustrates a first embodiment of the start-up process 310 illustrated in FIG. 3. Initially at 311, a determination is made as to whether any output symbols of degree one are present. If so, the source symbol associated with that output symbol is recovered at 312. The process then returns to 311, where a subsequent determination is made as to whether any other output symbols of degree one remain in the code. If at 311 no output symbols of degree one remain, the process proceeds to the source symbol selection and deactivation process 320, further described below.

Figure 4B:
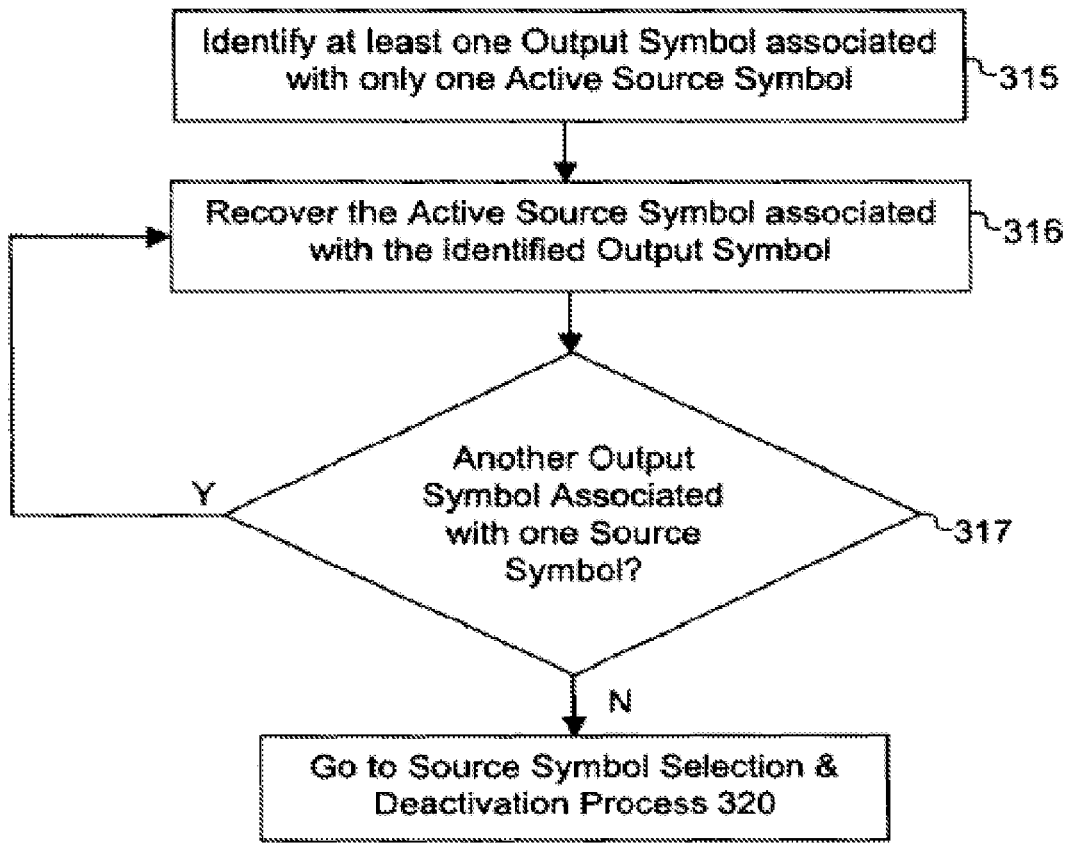
FIG. 4B illustrates a second embodiment of the start-up process 310 shown in FIG. 3.

FIG. 4B illustrates a second embodiment of the start-up process 310 illustrated in FIG. 3. In this embodiment, an output symbol of degree one is identified at 315. Subsequently at 316, the source symbol associated with the identified output symbol is recovered. Next at 317, a determination is made as to whether any other output symbol of degree one remains. If so, the process returns to 316 where the associated source symbol is recovered. If not, the process proceeds to the source symbol selection and deactivation processes described below.

In one embodiment of the invention, recovery of source symbols described in 310 occur temporally before the recovery of deactivated and recoverable source symbols referred to in 320. However, the invention is not limited thereto, and recovery of the source symbols identified in 310 may occur substantially concurrently with the recovery of the deactivated and recoverable source symbols in process 330 in alternative embodiments of the present invention.

Figure 5:
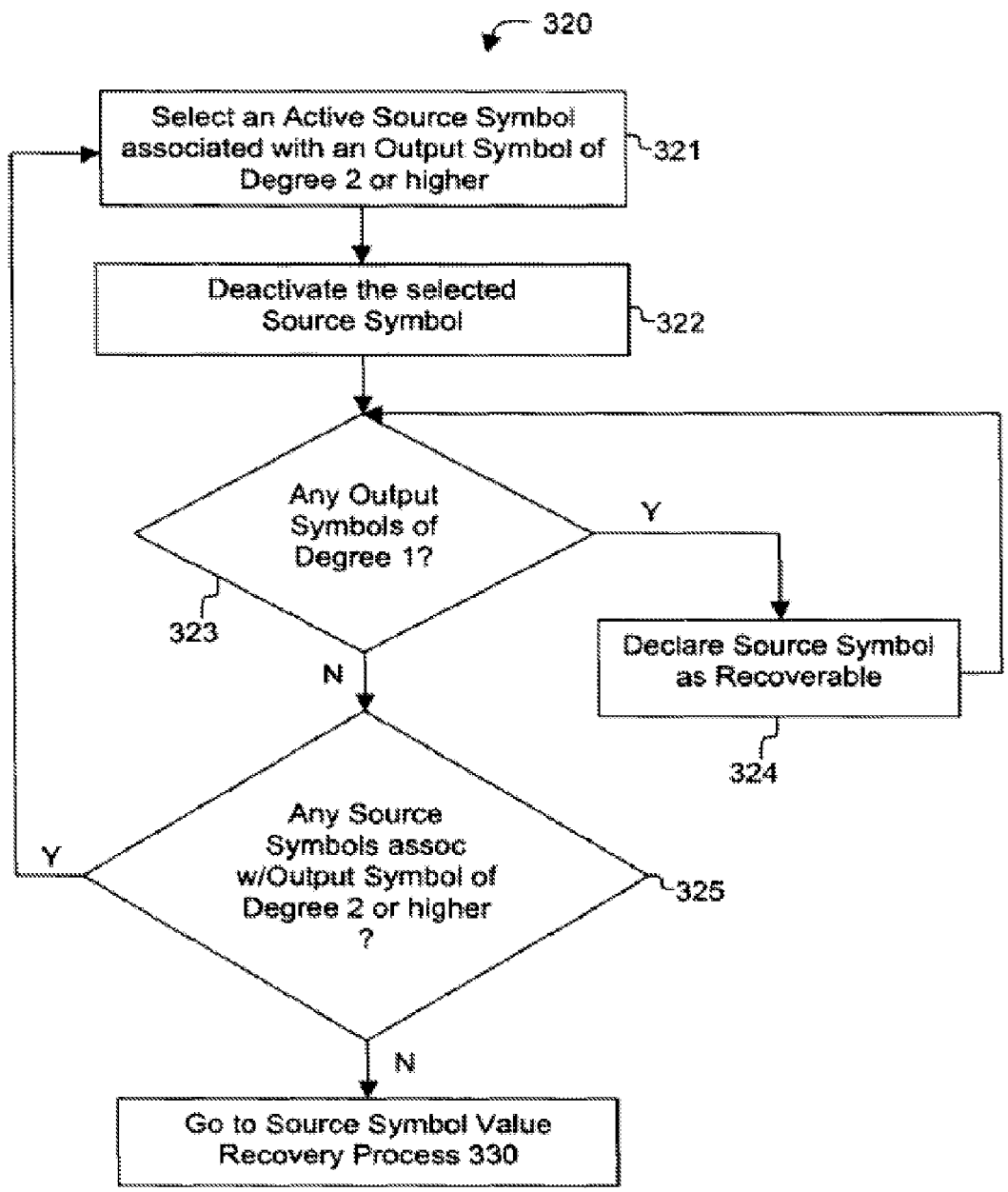
FIG. 5 illustrates a first embodiment of the source symbol selection and deactivation process shown in FIG. 3.

FIG. 5 illustrates a first embodiment of the source symbol selection and deactivation process 320 illustrated in FIG. 3. Initially at 321, an active source symbol is selected which is associated with an output symbol of degree two or higher (i.e., an output symbols associated with two or more source symbols). The manner by which a particular source symbol is selected from among a number of similar source symbols is described in greater detail below. Next at 322, the particular source symbol selected is deactivated. Subsequently at 323, determination is made as to whether any output symbols of degree one exist for decoding. In some embodiments, the preceding deactivation will produce one or more output symbols of degree one. In other embodiments, the preceding deactivation will not result in an output symbol of degree one. In the later case, the process repeats the process of 321-323 as described below.

If the deactivation process of 322 does result in the production of one or more output symbols of degree one, the process continues at 324 where the source symbol associated with an output symbol of degree one is declared recoverable. The process then returns to 323 where a determination is made as to whether any additional output symbols of degree one remain. The processes of 323 and 324 are repeated until all of the output symbols of degree one produced by the preceding deactivation process are declared recoverable.

If the deactivation of the selected source symbol at 322 does not result in an output symbol of degree one, or once all of the source symbols associated with an output symbol of degree one are declared recoverable at 324, the process continues from 323 to 325, where a determination is made as to whether any source symbols associated with output symbols of degree two or higher remain. If so, the process returns to 321 where another active source symbol associated with an output symbol of degree two or higher is selected, deactivated, and the presence of output symbols of degree one is checked. One or more iterations of the processes may occur, for instance, where the deactivation of a first source symbol associated with an output symbol of degree two or higher does not result in an output symbol of degree one, but additional source symbols associated with an output symbol of degree two (or higher) remain. In this case, the subsequent deactivation of another source symbol associated with an output symbol of degree two (or higher) may produce one or more output symbols of degree one. The process repeats until all source symbols have been either been recovered (via the start-up process 310), deactivated (via 322), or declared recoverable (via 325), at which point the process proceeds to the source symbol value recovery process 330.

Figure 6:
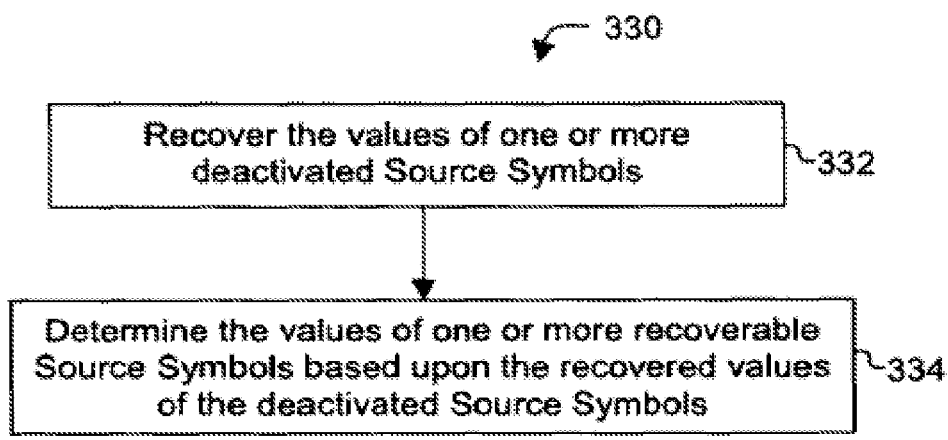
FIG. 6 illustrates one embodiment of the source symbol recovery process shown in FIG. 3.

FIG. 6 illustrates one embodiment of the source symbol recovery process 330 illustrated in FIG. 3. Initially at 332, the values of one or more source symbols deactivated in 322 are recovered. In a specific embodiment, for instance in which Gaussian elimination is used in the decoding process, all values of deactivated source symbols are recovered in this process. Subsequently at 334, the values of one or more source symbols declared recoverable in process 325 are determined using the recovered values of the deactivated source symbols. In one implementation, such as the aforementioned in which Gaussian elimination is used, the values of all recoverable source symbols are determined in this process. In alternative embodiments of 332 and 334, the values of one or more, but fewer than all of the recoverable source symbols are determined This may be advantageous when, for reasons of necessity, expediency, cost, etc., a complete decoding of the chain reaction code is not required or possible. The processes of 332 and 336 are further illustrated in a specific embodiment below.

Figure 7A:
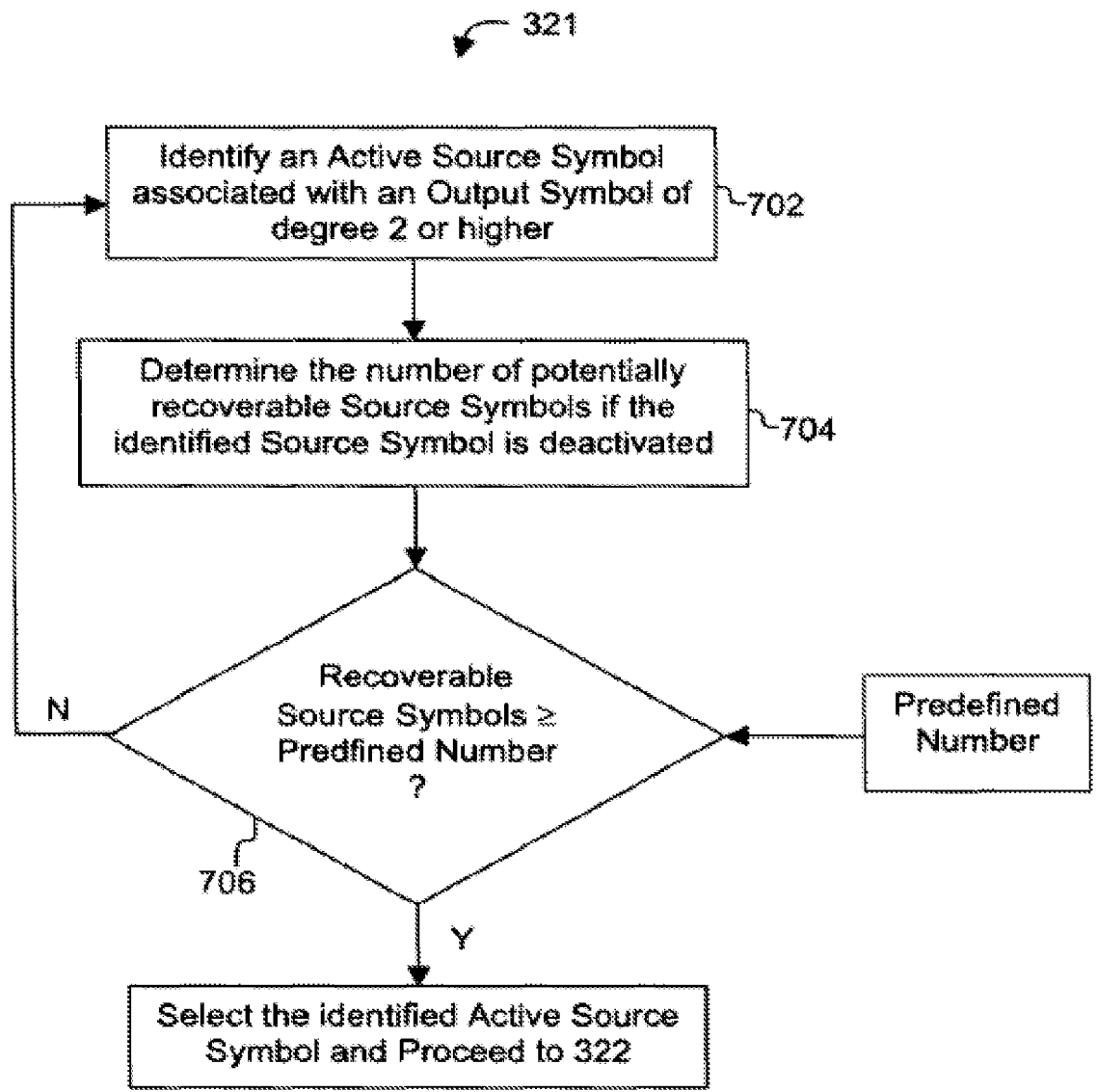
FIG. 7A illustrates a second embodiment of the source symbol selection process shown in FIG. 3.

FIG. 7A illustrates a second embodiment of the source symbol selection process 321, whereby an active source symbol associated with an output symbol of degree at least two is selected for deactivation. Initially at 702, an active source symbol associated with an output symbol of degree two or higher is identified. Next at 704, a determination is made as to the number of source symbols that are potentially recoverable (i.e., source symbols which may become recoverable without further source symbol inactivation) if the identified source symbol were deactivated. Next at 706, a comparison is made between the number of potentially recoverable source symbols, and a predefined number, whereby if the number of potentially recoverable source symbols exceeds the predefined number, the identified source symbol is selected for deactivation in 322. If the number of potentially recoverable source symbols does not meet or exceed the predefined number, then the process returns to 702 where another source symbol associated with an output symbol of two or higher is identified.

Those of skill in the art will appreciate that other selection criteria may be used to select source symbols in order to obtain the largest number of output symbols of degree one. For example in one process, the source symbol associated with the largest number of output symbols is selected for deactivation. In another embodiment, a source symbol is randomly selected from a group of those source symbols associated with two or more output symbols. In still a further embodiment, an output symbol is identified which is associated with a predetermined number of source symbols, e.g., the fewest. Subsequently, all but one of the source symbols is selected for deactivation.

In another embodiment of the source symbol selection process, a string of source symbols may be recovered. In this process, an output symbol of degree two is to be identified such that one of its associated source symbols is itself associated with a second output symbol of degree two, and such that one of its associated source symbols is itself associated with a third output symbol of degree two, and so on. Such a chain of output symbols will be called a degree-two-chain hereinafter.

Figure 7B:
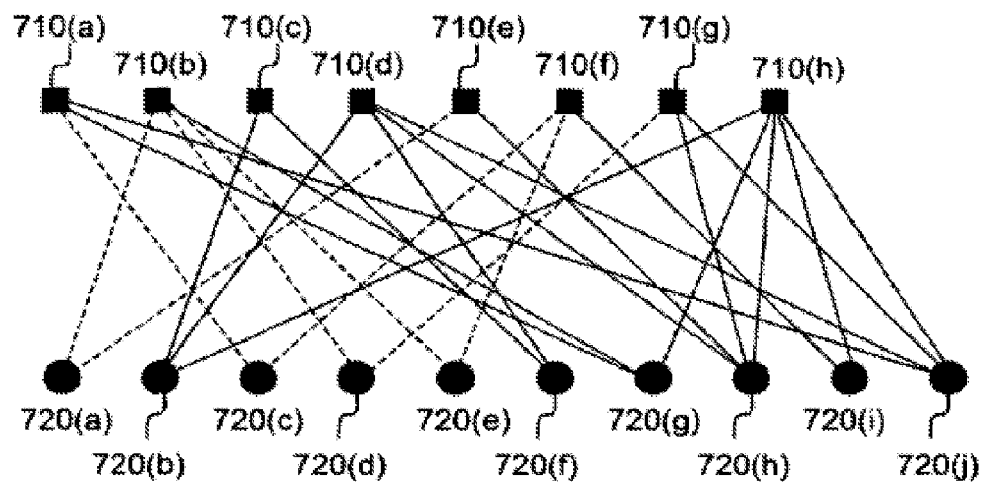
FIG. 7B illustrates a decoding graph for a degree-2 chain in accordance with one embodiment of the present invention.

FIG. 7B illustrates a decoding graph of a degree-two chain in accordance with one embodiment of the present invention. The output symbols that participate in one possible degree- 2-chain are 720(*a*), 720(*c*), 720(*d*), 720(*e*), and 720(*h*). Deactivating, for example, source symbol 710(*a*) reduces the degree of output symbol 720(*c*) to one, which makes source symbol 710(*f*) recoverable, which in turn reduces the degree of output symbol 720(*e*) to one. This makes source symbol 710(*b*) recoverable, which reduces the degrees of 720(*a*) and 720(*d*) to one, and these make 710(*g*) and 710(*e*) recoverable. As can be seen, if the number of output symbols in such a chain is k, and if any of the associated source symbols of any of the output symbols in such a chain is deactivated, then the existence of an output symbol of degree one is guaranteed for k consecutive steps of inactivation decoding. This process may further include identifying an output symbol of degree two which leads to a degree-2-chain of maximal length, and deactivating a source symbol associated with the identified output symbol.

Any of the source symbol selection processes may further include a "back-tracking process" by which the deactivated source symbol is reactivated, and another source symbol is selected for deactivation in accordance with the methods presented herein. The invention is not limited to the exemplary processes by which a source symbol is selected for deactivation, and any method in which a source symbol associated with two or more output symbols is selected can be used in the present invention.

Figure 2:
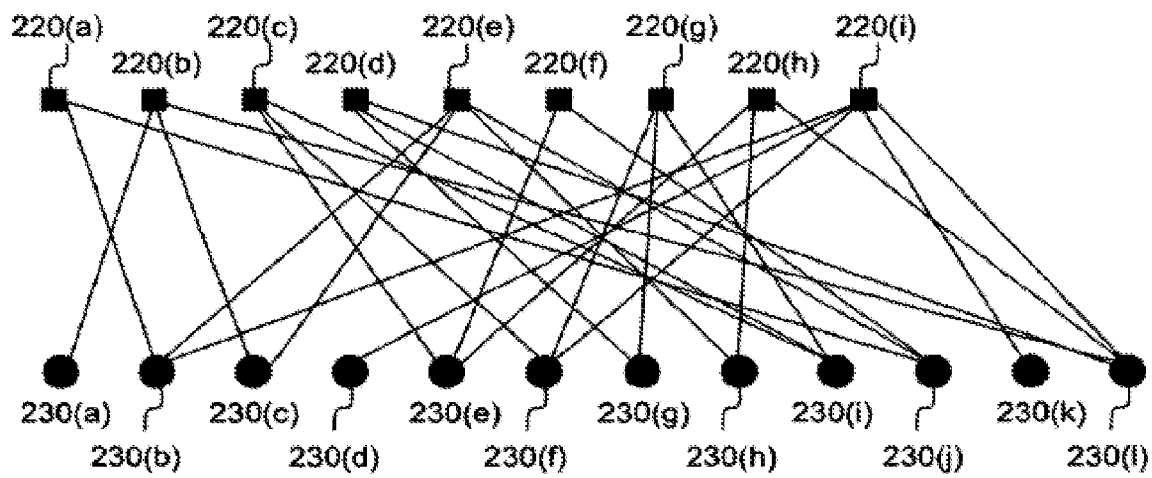
FIG. 2A illustrates an exemplary process for decoding chain reaction encoded output symbols.
FIG. 2B illustrates a decoding matrix corresponding to the decoding graph of FIG. 2A.
Figure 8A:
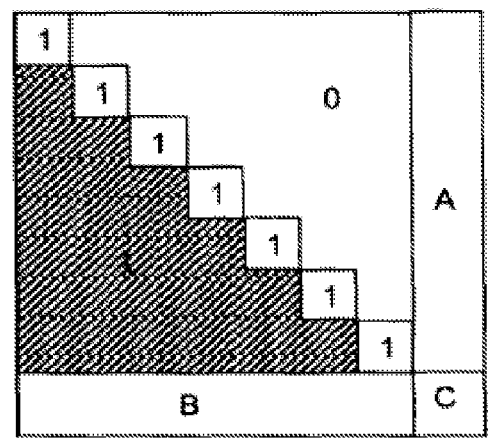
FIG. 8A illustrates a modified decoding matrix in accordance with the present invention.

As explained above with reference to FIG. 2B, a decoding matrix is useful in the decoding of chain reaction codes. With particular regard to the decoding process using inactivation, the decoding matrix 200 of FIG. 2B can be modified to accommodate the inclusion of inactive source symbols. Specifically, where the sequence of indices of inactive source symbols during the decoding process is the sequence $i_1, i_2, \ldots, i_n$ and the number of source symbols is K, then inactivation decoding produces permutation matrices P and Q, where Q interchanges columns $i_1$ and K−n+1, $i_2$ and K−n+2, ..., and $i_n$ and K, and such that P·M·Q has the shape given in FIG. 8B. The modified decoding matrix shown in FIG. 8A consists of a lower triangular matrix L, and submatrices A, B, and C. The columns of the submatrix A correspond to the inactive source symbols. The task of the decoder is to solve the system of K' linear equations in K unknowns $x_1, \ldots, x_K$ given by $$P \cdot M \cdot Q \cdot (Q^{-1} x) = P \cdot b,$$

where x is the column vector $(x_1, \ldots, x_K)$, and b is the vector consisting of the values of the K' received output symbols. In practice, the matrices P and Q may not be stored as full matrices, but as permutations computed by tracking the process of the Inactivation Decoding. This form usually requires much less memory than the storage of a complete matrix. As can be appreciated by those skilled in the art, the recovery process does not depend on the specific permutation of the columns of the illustrated decoding matrix, and other column permutations may be used in alternative embodiments under the present invention.

Of the many ways possible for computing the solution x of the system of equations given above, we will illustrate in the following one possibility. This is served for descriptive purposes only and is not intended to limit the scope of this invention.

For the description of the core of the algorithm, it is advantageous to denote the vector $Q^{-1} \cdot x$ by y, and redefine the task of decoding as the task of computing the vector y. Once y is computed, x may be efficiently computed as the permutation of y described by Q. Further, the matrix P·M·Q is denoted by N; the vector P·b is denoted by c, that is, c is the permutation of b described by P, which is again efficient to compute. The task is then to calculate the vector y satisfying N·y=c, where N has the shape given in FIG. 8A.

Figure 8B:
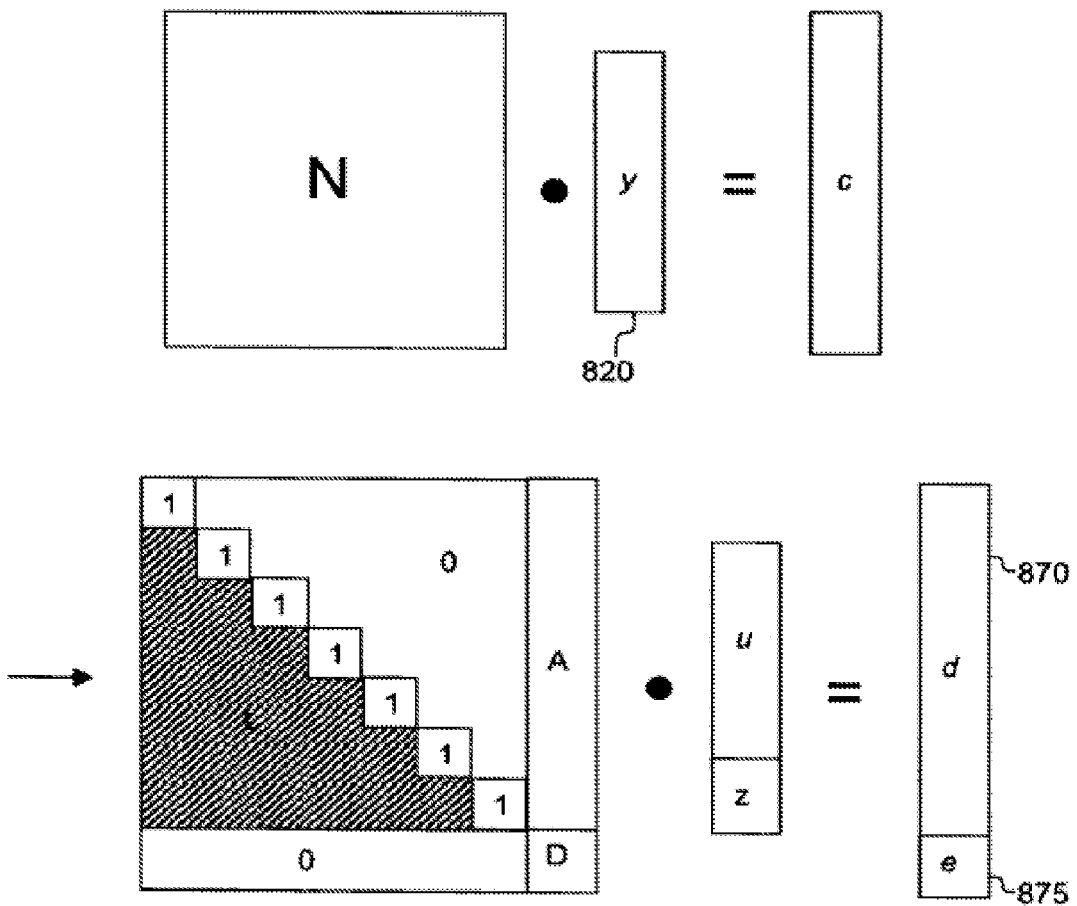
FIG. 8B illustrates the process of applying Gaussian elimination to the decoding matrix in accordance with one embodiment of the present invention.

To solve this system, Gaussian elimination may be applied to matrix N. The rows of the submatrix B are eliminated by the rows of the lower triangular matrix L. The same transformation is applied to the vector c. This action transforms the matrix B into the matrix consisting of zeros, and the matrix C is transformed into a different matrix D, obtained by applying the same elimination steps to the matrices A and C. This transformation is shown in FIG. 8B. Assuming that n source symbols have been deactivated, and that there are K source and K' output symbols, the submatrix L has (K−n) rows and (K−n) columns, the matrix A has (K−n) rows and n columns, and the matrix D has (K'−K+n) rows and n columns. The submatrices L and A in the transformed matrix are the same as the corresponding submatrices in the matrix N. The vector b is also transformed into another vector f having two components: the vector d given in 870 which consists of the first K−n components off, and the vector e in 875 consisting of the remaining components off. Correspondingly, the unknown vector y in 820 is subdivided into two subvectors. The vector u consisting of the first K−n entries of y, and the vector z consisting of the remaining n entries.

This elimination transforms the original system of equations into two separate systems: the system given by D·z=e, and the system L·u+A·z=d. The values of the unknown vector z correspond to the values of the source symbols corresponding to the inactivated source symbols. Once these values are found from the set of equations D z=e, the remaining values given by u can be found in a variety of ways. In some embodiments of the present invention, these values can be found by multiplying the matrix A with z, XOR'ing the resulting vector with d to obtain a vector g, and solving the system of equations L·u=g. In some embodiments, the latter system may be solved using a chain reaction decoder. In yet other embodiments, the value of each source symbol corresponding to an inactive source symbol is XOR'd with the values of the output symbols corresponding to the neighboring output symbols associated to said source symbol, and the inactive source symbol is removed from the corresponding decoding graph (not shown). This produces a new restricted decoding graph with all the inactive source symbols removed. Then a normal chain reaction decoding may be applied to the restricted Decoding Graph to recover the other source symbols.

The system of equations D·z=e can be solved in a variety of ways. In some embodiments, this system may be solved using the Gaussian elimination algorithm. In other embodiments, the inactivation decoding may be applied recursively to obtain the unknown values of the inactive source symbols. Other methods for solving systems of linear equations may also be applied.

In some embodiments of the inactivation decoder, the decoding process may begin before all the output symbols have been entered into the decoding graph. In these embodiments, whenever the decoding graph has no more output symbols of degree one and has at least one active source symbol, the above-described strategies may be employed to determine whether to inactivate a source symbol or whether to enter another output symbol into the Decoding Graph if such an output symbol exists. In cases where the decoding process begins before all the output symbols have been collected, the creation of the decoding matrix, and the elimination process for the decoding matrix may happen substantially concurrently with the reception process, with one or more steps of the elimination process being done with the reception of every new output symbol. Alternatively, more than one output symbol could be collected at a time, and decoding could proceed until all the said output symbols are processed; if not all source symbols are recovered at this point, another set of output symbols could be requested and processed, until all the source symbols have been recovered.

Figure 9A:
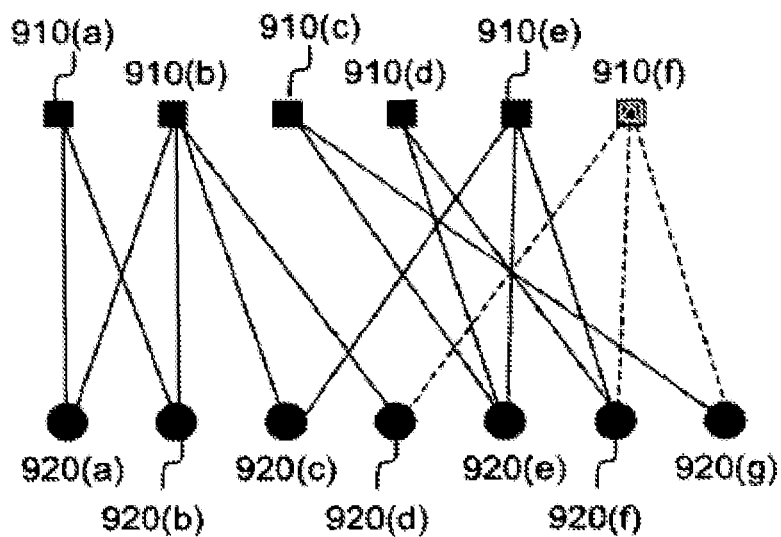
FIGS. 9A and 9B illustrate an example of inactivation decoding using decoding graphs and matrices in accordance with one embodiment of the present invention.
Figure 9B:
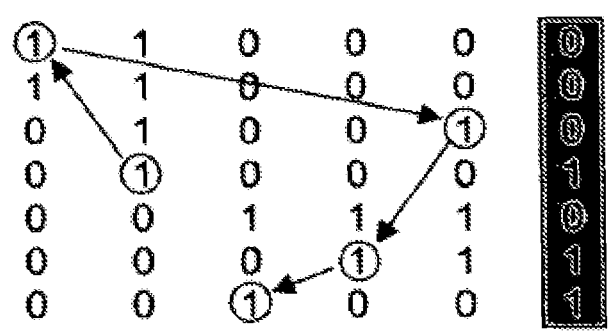

FIGS. 9A and 9B illustrate an example of inactivation decoding using the aforementioned decoding graphs and matrices in accordance with one embodiment of the present invention. The original decoding graph of FIG. 9A contains six source symbols denoted 910(*a*)-910(*f*), and seven output symbols denoted 920(*a*)-920(*g*). As can be seen, conventional chain reaction decoding cannot even begin on this graph, since there are no output symbols of degree one. By deactivating source symbol 910(*f*), chain reaction decoding can begin, and at each stage an output symbol of degree one is found.

FIG. 9B illustrates the permutation occurring within the decoding matrix as a result of the inactivation process. Deactivating symbol 910(*f*) results in deactivating the last column of the matrix. The remaining columns can then be transformed into a lower triangular form. The sequence of circles and arrows indicate the order in which the rows and columns have to be permuted, by noting that a position that the k-th arrow points to needs to be permuted with position (k,k) of the new lower triangular matrix. For example, the permutations have to be done in the order so that position (2,4) becomes position (1,1), position (1,1) becomes position (2,2), position (3,5) becomes position (3,3), etc.

Figure 10A:
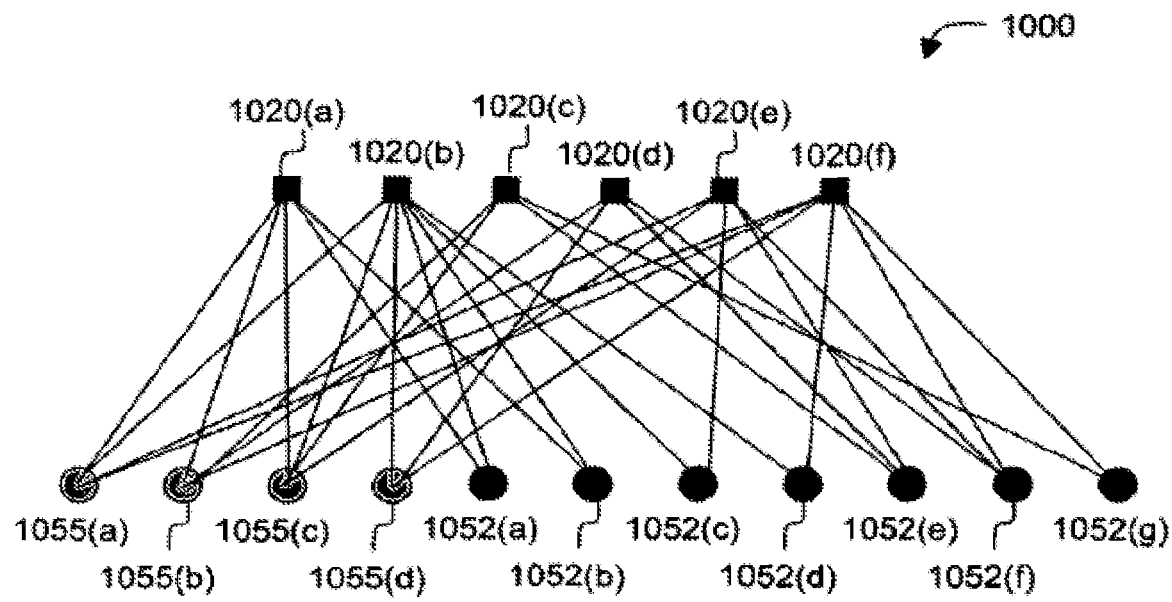
FIG. 10A illustrates a modified decoding graph useful in decoding a multi-stage chain reaction code in accordance with one embodiment of the present invention.

FIG. 10A illustrates a modified decoding graph 1000 useful in decoding a multistage chain reaction code, such as that described in Raptor. The graph 1000 includes a plurality of source symbols 1020(*a*)-(*f*) and multi-stage output symbols 1050, which collectively include previously described output symbols 1052(*a*)-(*g*), and check symbols 1055(*a*)-(*d*). The output symbols 1052 are as previously described, each being associated with one or more source symbols. Each of the check symbols 1055 is also associated with on or more source symbols and describes the mathematical relationship between two or more source symbols. For example, symbol 1055(*a*) means that the XOR of the values of the source symbols corresponding to source symbols 1020(*a*), 1020(*b*), 1020(*e*), and 1020(*f*) is zero. The interrelationship between source symbols may be imparted by a static encoding process such as low-density parity-check code and the like.

As a particular example, where a low-density parity-check code is used for the static encoding process, then a number of multi-stage output symbols equal to the number of check symbols in this code may be added to the decoding graph, their value set to 0, and the decoding graph may be augmented by the graph of the low-density parity-check code between the source symbols and the check symbols, and the decoding graph may be replaced by the new graph. The choice of low-density parity-check codes is not essential to this application. In general, for any type of static encoding, the corresponding parity-check matrix defines a bipartite graph by which the decoding graph may be augmented.

Figure 10B:
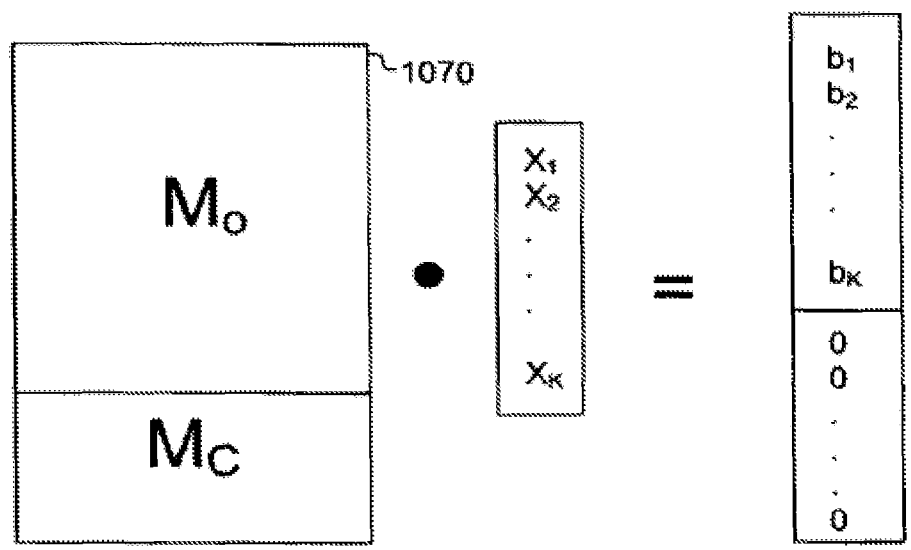
FIG. 10B illustrates a modified decoding matrix corresponding to the modified decoding graph 10A.

FIG. 10B illustrates a modified decoding matrix 1070 which corresponds to the modified decoding graph 10A. The modified decoding matrix 1070 is populated with zeros and ones, and has as many columns as there are source symbols, and as many rows as the aggregate number of output symbols and check symbols. Correspondingly, the modified decoding matrix 1070 consists of two sets of rows, one corresponding to the output symbols, and one corresponding to the check symbols. Where there are K' output symbols, C check symbols, and K source symbols, the modified decoding matrix may be decomposed into a submatrix $M_o$ consisting of K' rows and K columns, and a matrix $M_c$ consisting of C rows and K columns. If $x_1, \ldots, x_K$ denote the unknown values of the source symbols, and $b_1, \ldots, b_K$ denote the known values of the received output symbols, the task of the decoder may be to solve the system of equations given by $M_o \cdot x = b$, and $M_c \cdot x = 0$. The combined system of equations would be as given in FIG. 10B.

In some embodiments of this invention, inactivation decoding may proceed in the same manner as described above, with the decoding graph of FIG. 9A being replaced by the modified decoding graph of FIG. 10A, and the decoding matrix of 8B replaced by the modified decoding matrix of FIG. 10B. In other embodiments, the different symbols of the modified decoding graph 1000 may be given different priorities during the different phases of the decoding. For example, the decoding may start by processing output symbols only, and resorting to check symbols of degree one only if there are no output symbols of degree one left. In some applications, this may lead to lower memory and computational resources, as check symbols are injected into the modified decoding graph on an as-needed basis.

Each of the methods described herein may be practiced in a multitude of different ways (i.e., software, hardware, or a combination of both) and in a variety of systems. In one embodiment, the described methods can be implemented as instruction codes stored either on a computer readable disk, in memory (volatile or non-volatile), or reside within a processor (computer, embedded processor, and the like). In addition, a system for decoding a chain reaction code using the inactivation techniques described herein may comprise a computer or other such programmable machine having a memory operable to store and/or execute instruction codes corresponding to the processes described herein.

Figure 11A:
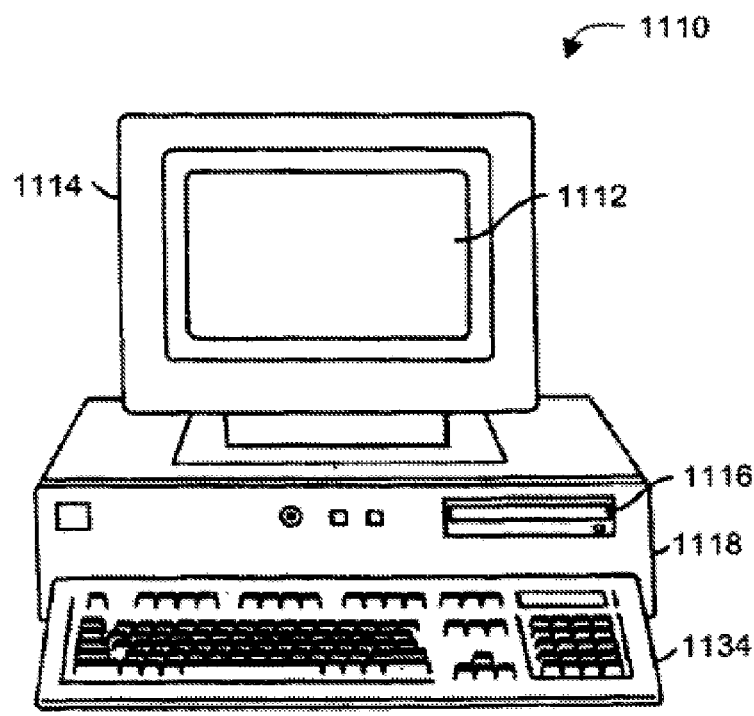
FIG. 11A illustrates an exemplary computer system operable to execute instruction codes corresponding to processes of the described methods in accordance with the present invention.

FIG. 11A illustrates an exemplary computer system operable to execute instruction codes corresponding to processes of the described methods. Computer system 1110 includes a monitor 1114, screen 1112, cabinet 1118, and keyboard 1134. A mouse (not shown), light pen, or other 110 interfaces, such as virtual reality interfaces may also be included for providing I/O commands. Cabinet 1118 houses a drive 1116 for removable media such as CD or DVD, and a hard drive (not shown). The computer system 1110 may include drives and/or drive interfaces which operable to record onto or read from data, instruction code, and other information needed to execute the methods of the present invention. Cabinet 1118 also houses familiar computer components (not shown) such as a processor, memory, and the like.

Figure 11B:
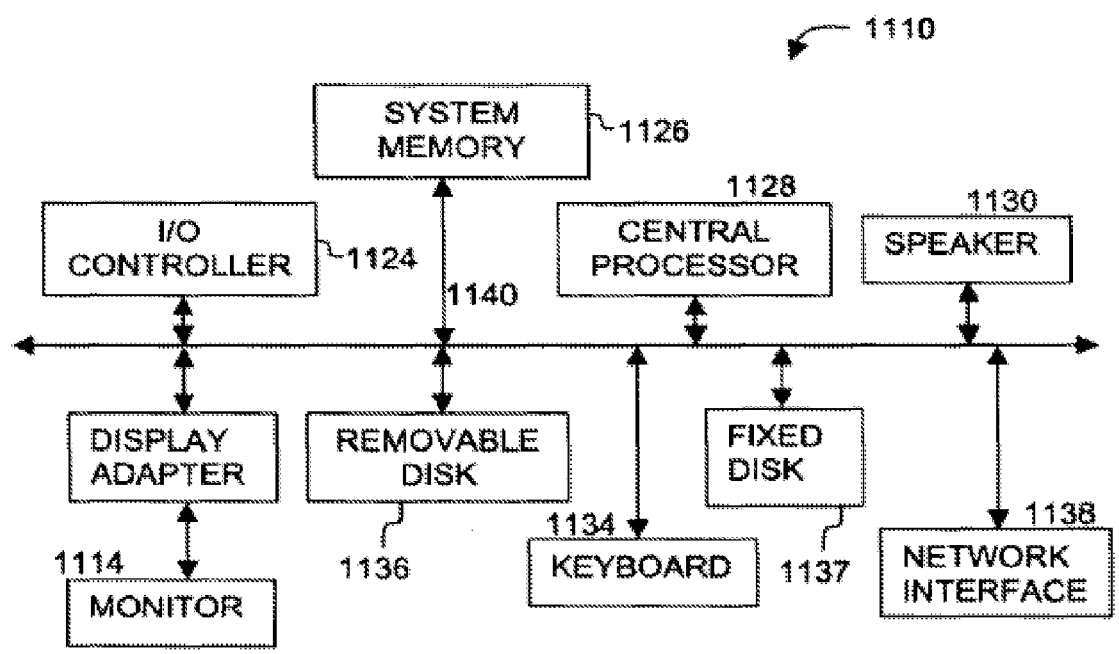
FIG. 11B illustrates a simplified system block diagram of the exemplary computer system used to execute instruction codes corresponding to the described methods in accordance with the present invention.

FIG. 11B illustrates a simplified system block diagram of the exemplary computer system 1110 used to execute instruction codes corresponding to the described methods. As shown in FIG. 11A, computer system 1110 includes monitor 1114 which optionally is interactive with the I/O controller 1124. Computer system 1110 further includes subsystems such as system memory 1126, central processor 1128, speaker 1130, removable disk 1136, keyboard 1134, fixed disk 1137, and network interface 1138. Other computer systems suitable for use with the described methods may include additional or fewer subsystems. For example, another computer system could include an additional processor. Arrows such as 1140 represent the system bus architecture of computer system 1110. However, these arrows 1140 are illustrative of any interconnection scheme serving to link the subsystems. For example, a local bus could be utilized to connect the central processor 1128 to the system memory 1126. Computer system 1110 shown in FIG. 11B is but an example of a computer system suitable for use with the present invention. Other configurations of subsystems suitable for use with the present invention will be readily apparent to one of ordinary skill in the art.

Accordingly, in some embodiments of the present invention the inactivation decoding mechanism is used to reduce the reception overhead of chain reaction coding when the entire original content needs to be reconstructed.

In other embodiments of the present invention, the inactivation decoder is used to reduce the average degree of an output symbol, and hence decrease the computational resources used for creating output symbols.

Another property of a chain reaction coding system using an inactivation decoder is that a weight table can be designed in which none of the output symbols may be of degree one. This means that none of the output symbols of such a coding system contains the value of an input symbol. In some embodiments, this property can be used to reduce the average degree of the output symbols, thereby decreasing the computational load on the encoder. Moreover, in some applications, this property may be used to give the transmission a light level of security against unauthorized access to the original data.

Inactivation Decoding Example

An embodiment of a chain reaction coding system as disclosed in Raptor is described by the number of data symbols, denoted N, a static encoding which generates R static encoding symbols, and a dynamic encoder described by a weight table. In some embodiments a reception overhead may also be specified that gives good probabilistic guarantees of the success of the decoder. In other embodiments, output symbols may be collected until complete decoding is possible, and there is no need for specifying a reception overhead.

The following table describes various parameters for an exemplary inactivation decoder, with the first column giving the range for the value N, the second giving information on the generation of static encoding symbols, the third giving the weight table for the generation of dynamic encoding symbols, and finally the fourth giving the number of static encoding symbols computed:

| | | | | |
|---|---|---|---|---|
| 1-200 | 9 | 1 | S0 | 5% + 130 |
| 200-970 | 9 | 1 | S1 | 5% + 130 |
| 970-1250 | 9 | 1 | S1 | 5% + 140 |
| 1250-1320 | 9 | 1 | S1 | 5% + 130 |
| 1320-2100 | 3 | 0.5 | S1 | 5% + 110 |
| | 5 | 0.5 | | |
| 2100-2500 | 1 | 2/3 | S1 | 5% + 100 |
| | 9 | 1/3 | | |
| 2500-4100 | 1 | 2/3 | S1 | 5% + 100 |
| | 8 | 1/3 | | |
| 4100-5000 | 1 | 2/3 | S1 | 5% + 100 |
| | 7 | 1/3 | | |
| 5000-8100 | 1 | 2/3 | S2 | 5% + 100 |
| | 7 | 1/3 | | |
| 8100-16500 | 1 | 2/3 | S2 | 5% + 100 |
| | 6 | 1/3 | | |
| 16500-65536 | 1 | 2/3 | S2 | 5% + 100 |
| | 5 | 1/3 | | |
| >65536 | 1 | 2/3 | S2 | 5% + 100 |
| | 4 | 1/3 | | |

For example, the ninth row in the table means that if N is between 5000-8100, then the number R of static encoding symbols is the smallest integer greater than or equal to 0.05*N+100. In all the cases, the first stage of the static encoder may use first a Hamming code to encode the original symbols, as described in Raptor. The second stage may use a low-density parity-check code. In the example given by the ninth row, the parity-check matrix of this code consists of two submatrices. The first has $\lfloor 2*R/3 \rfloor$ rows and N+R columns, where $\lfloor a \rfloor$ denotes the largest integer smaller than or equal to a. The second submatrix has $R-\lfloor 2*R/3 \rfloor$ rows and N+R columns. Each of these submatrices is picked randomly subject to the condition that in the first matrix each column has exactly 1 nonzero entry, and in the second matrix each column has exactly 7 nonzero entries.

The weight tables corresponding to S0, S1, and S2 are given by:

Weight Table for S0

| Weight | Probability |
|---|---|
| 7 | 1 |

Weight Table for S1

| Weight | Probability |
|---|---|
| 1 | 0.0221538 |
| 2 | 0.492912 |
| 3 | 0.166059 |
| 4 | 0.0768401 |
| 5 | 0.0803003 |
| 8 | 0.0636444 |
| 9 | 0.0353027 |
| 19 | 0.0439408 |
| 20 | 0.0188495 |

Weight Table for S2

| Weight | Probability |
|---|---|
| 1 | 0.008199 |
| 2 | 0.507871 |
| 3 | 0.171036 |
| 4 | 0.074750 |
| 5 | 0.084950 |
| 8 | 0.057682 |
| 9 | 0.038307 |
| 19 | 0.057200 |

The average weights of S1 and S2 are 4.254 and 4.154, respectively.

If the reception overhead is fixed at 5% or 50, whichever is larger, then it can be mathematically proven that the probability of failure of the inactivation decoding is less than $10^{-13}$. The concrete example given here is only for illustrative purposes. Variations of the actual numbers lead to designs which are within the scope of this invention.

Figure 12A:
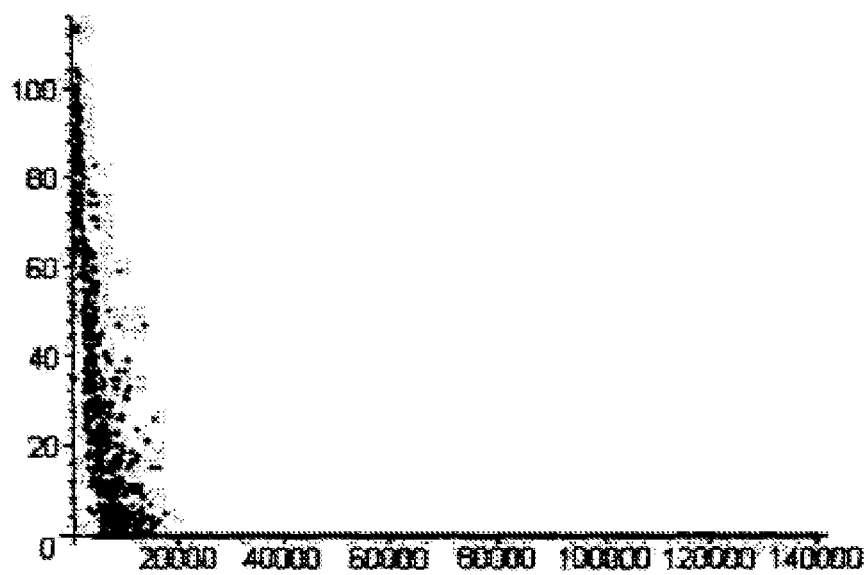
FIGS. 12A-12B show plots describing several thousand computer simulations of the inactivation decoder for various values of the number of input symbols N.
Figure 12B:
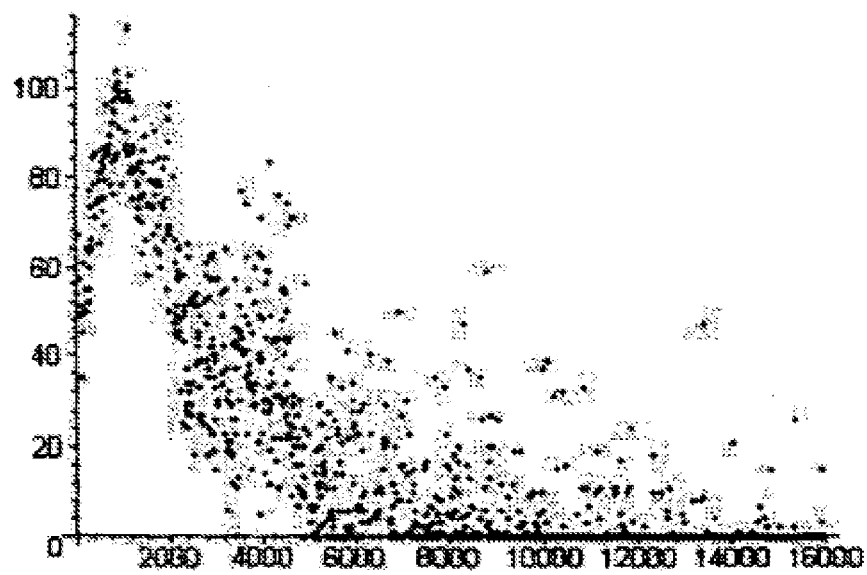

FIGS. 12A-12B show plots describing several thousand computer simulations of the inactivation decoder for various values of the number of input symbols N. The horizontal axis denotes N, and the vertical axis denotes the number of inactive source symbols in the Modified Decoding Graph. Each point represents one round of simulation. FIG. 10(a) shows the results for the range of N between 1 and 140,000. FIG. 10(b) is the magnification of FIG. 10(a) for the range of N between 1 and 16,000.

As can be seen, in some of the runs the number of inactive source symbols is zero, meaning that the normal chain reaction decoder would have completed the decoding. However, where N is between 1 and 10,000, in the majority of the cases the number of inactive source symbols is larger than one. In these cases the normal chain reaction decoder would have failed. The number of inactivated source symbols is very often zero if the number N of source symbols is larger than 20,000. In these cases, the decoder is particularly fast, while giving exceptionally good probabilistic guarantees on successful decoding.

The foregoing description has been presented for purposes of illustration and description. It is not intended to be exhaustive or to limit the invention to the precise form disclosed, and obviously many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

REFERENCES INCORPORATED HEREIN

The following references are herein incorporated by reference in their entirety for all purposes:
U.S. Pat. No. 6,307,487 entitled: "Information Additive Code Generator and Decoder for Communication Systems"
U.S. patent application Ser. No. 10/032,156 entitled: "Multi-Stage Code Generator and Decoder for Communication Systems"

What is claimed is:

1. A decoder configured to function in a chain reaction code communication system wherein an encoder generates a plurality of multi-stage output symbols that are check symbols and generates a plurality of source symbols, wherein each of the check symbols is associated with one or more source symbols, the check symbols associated with one or more source symbols referred to as check symbols of degree one or higher, wherein at least one check symbol is associated with at least two source symbols, the check symbols associated with two or more source symbols referred to as check symbols of degree two or higher, and wherein at least one source symbol is marked as active, the decoder comprising:
   (i) a selector configured to select one of the active source symbols associated with a check symbol of degree two or higher; and
   (ii) an activate module communicatively coupled to the selector and configured to deactivate the selected source symbol associated with a check symbol of degree two or higher.

2. The decoder of claim 1, wherein a transmitter transmits the one or more source symbols to a receiver, the decoder further comprising:
   a processor communicatively coupled to the activate module and configured to infer the check symbols without having to receive them from the transmitter; and to use the inferred check symbols to check that the one or more source symbols were received correctly.

3. A decoder for decoding input symbols from output symbols, wherein output symbols are generated at an encoder for source symbols derived from the input symbols and check symbols associated with source symbols, wherein a degree of a check symbol is the number of source symbols associated with that check symbol and the degree of check symbols can be one or more than one, the decoder comprising:
   a receiver configured to receive output symbols and check symbols; and
   a processor communicatively coupled to the receiver and configured to mark source symbols as active to indicate that it is to be decoded from received output symbols and check symbols; mark at least one of the active source symbols that is associated with a check symbol of degree two or higher as an inactive source symbol; decode, in part, the received source symbols, by decoding the active source symbols; determine a process for decoding the inactive source symbols; and to decode the inactive source symbols.

4. The decoder of claim 3, wherein the check symbols are generated according to a parity code.

5. The decoder of claim 3, wherein the check symbols are generated according to an LDPC code.

6. A decoder for decoding source symbols from output symbols, wherein output symbols are generated at an encoder derived from the source symbols, wherein a degree of an output symbol is the number of source symbols associated with that output symbol, the decoder comprising:
   a receiver configured to (i) receive a first set of output symbols; and
   a processor communicatively coupled to the receiver and configured to:
      (ii) recover source symbols from the output symbols contained in the first set of output symbols;
      (iii) deactivate one or more unrecovered source symbols associated with an output symbol of degree two or higher thereby reducing the degree of any output symbol associated with a deactivated source symbol by one;
      (iv) repeat (ii) and (iii) until all of the output symbols in the first set of output symbols have been used; and
      (v) decode the source symbols that have been deactivated.

7. The decoder of claim 6, wherein
the processor is further configured to:
   (vi) determine if all of the source symbols have been recovered; and
   (vii) request a second set of output symbols if it is determined that not all of the source symbols have been recovered;
the receiver is further configured to (viii) receive a second set of output symbols; and
the processor and the receiver are further configured to (ix) repeat (ii)-(viii) on the second set of output symbols until all of the source symbols have been recovered.

8. The decoder of claim 6, wherein
the receiver is further configured to (vi) receive a second set of output symbols; and
the processor is further configured to (vii) merge the second set of output symbols into the first set of output symbols.

9. The decoder of claim 8, wherein (vi) and (vii) are configured to occur substantially concurrently with (ii)-(v).

10. The decoder of claim 9, wherein (ii)-(vii) repeat until all of the source symbols have been recovered.

11. A decoder that receives multi-stage output symbols, wherein the multi-stage output symbols are generated at an encoder derived from output symbols and check symbols, wherein the output symbols are generated at an encoder derived from source symbols, wherein a degree of an output symbol is the number of source symbols associated with that output symbol, wherein a degree of a check symbol is the number of source symbols associated with that check symbol, the decoder comprising:
   a receiver configured to (i) receive a first set of multi-stage output symbols wherein at least one of the multi-stage output symbols in the first set of multi-stage output symbols comprises a check symbol and at least one of the multi-stage output symbols in the first set of output symbols comprises an output symbol; and a processor communicatively coupled to the receiver and configured to:
- (ii) recover source symbols from the output symbols contained in the first set of multistage output symbols;
- (iii) deactivate one or more unrecovered source symbols associated with an output symbol of degree two or higher thereby reducing the degree of any output symbol associated with a deactivated source symbol by one;
- (iv) repeat (ii) and (iii) until all of the output symbols in the first set of output symbols have been used;
- (v) decode the source symbols that have been deactivated; and
- (vi) recover check symbols from the check symbols in the first set of multi-stage output symbols.

12. The decoder of claim 11, wherein the processor is further configured to:
- (vii) determine if all of the source symbols have been recovered; and
- (viii) request a second set of multi-stage output symbols if it is determined that not all of the source symbols have been recovered;

the receiver is further configured to (ix) receive a second set of multi-stage output symbols; and the processor and the receiver are further configured to (x) repeat (ii)-(ix) on the second set of multi-stage output symbols until all of the source symbols have been recovered.

13. The decoder of claim 12, wherein the processor and the receiver are further configured to (xi) repeat (ii)-(ix) on the second set of multi-stage output symbols until all of the check symbols have been recovered.

14. The decoder of claim 11, wherein
the receiver is further configured to (vii) receive a second set of multi-stage output symbols; and
the processor is further configured to (viii) merge the second set of multi-stage output symbols into the first set of multi-stage output symbols.

15. The decoder of claim 14, wherein (vii) and (viii) occur substantially concurrently with steps (ii)-(vi).

16. The decoder of claim 15, wherein (ii)-(viii) repeat until all of the source symbols have been recovered.

17. The decoder of claim 16, wherein (ii)-(viii) repeat until all of the check symbols have been recovered.

18. The decoder of claim 15, wherein (vi) can be interrupted in favor of (ii) if new output symbols containing source symbols are received.

19. A non-transitory computer program product in a chain reaction code communication system wherein an encoder generates a plurality of multi-stage output symbols that are check symbols and generates a plurality of source symbols, wherein each of the check symbols is associated with one or more source symbols, the check symbols associated with one or more source symbols referred to as check symbols of degree one or higher, wherein at least one check symbol is associated with at least two source symbols, the check symbols associated with two or more source symbols referred to as check symbols of degree two or higher, and wherein at least one source symbol is marked as active, the computer program product comprising:
a processor-readable medium storing processor-readable instructions configured to cause a processor to:
- (i) select one of the active source symbols associated with a check symbol of degree two or higher; and
- (ii) deactivate the selected source symbol associated with a check symbol of degree two or higher.

20. The product of claim 19, wherein a transmitter transmits the one or more source symbols to a receiver, and the instructions are further configured to cause the processor to:
infer, at a decoder at the receiver, the check symbols without having to receive them from the transmitter; and
use the inferred check symbols to check that the one or more source symbols were received correctly.

21. A non-transitory computer program product for decoding input symbols from output symbols, wherein output symbols are generated at an encoder for source symbols derived from the input symbols and check symbols associated with source symbols, wherein a degree of a check symbol is the number of source symbols associated with that check symbol and the degree of check symbols can be one or more than one, the computer program product comprising:
a processor-readable medium storing processor-readable instructions configured to cause a processor to:
receive output symbols and check symbols;
mark source symbols as active to indicate that it is to be decoded from received output symbols and check symbols;
mark at least one of the active source symbols that is associated with a check symbol of degree two or higher as an inactive source symbol;
decode, in part, the received source symbols, by decoding the active source symbols;
determine a process for decoding the inactive source symbols; and
decode the inactive source symbols.

22. The product of claim 21, wherein the check symbols are generated according to a parity code.

23. The product of claim 21, wherein the check symbols are generated according to an LDPC code.

24. A non-transitory computer program product for decoding source symbols from output symbols, wherein output symbols are generated at an encoder derived from the source symbols, wherein a degree of an output symbol is the number of source symbols associated with that output symbol, the computer program product comprising:
a processor-readable medium storing processor-readable instructions configured to cause a processor to:
- (i) receive a first set of output symbols;
- (ii) recover source symbols from the output symbols contained in the first set of output symbols;
- (iii) deactivate one or more unrecovered source symbols associated with an output symbol of degree two or higher thereby reducing the degree of any output symbol associated with a deactivated source symbol by one;
- (iv) repeat steps (ii) and (iii) until all of the output symbols in the first set of output symbols have been used; and
- (v) decode the source symbols that have been deactivated.

25. The product of claim 24, wherein the instructions are further configured to cause the processor to:
- (vi) determine if all of the source symbols have been recovered;
- (vii) request a second set of output symbols if it is determined that not all of the source symbols have been recovered;
- (viii) receive a second set of output symbols; and
- (ix) repeat steps (ii)-(viii) on the second set of output symbols until all of the source symbols have been recovered.

26. The product of claim 24, wherein the instructions are further configured to cause the processor to:
- (vi) receive a second set of output symbols; and
- (vii) merge the second set of output symbols into the first set of output symbols.

27. The product of claim 26, wherein steps (vi) and (vii) occur substantially concurrently with steps (ii)-(v).

28. The product of claim 27, wherein steps (ii)-(vii) repeat until all of the source symbols have been recovered.

29. A non-transitory computer program product for processing multi-stage output symbols, wherein the multi-stage output symbols are generated at an encoder derived from output symbols and check symbols, wherein the output symbols are generated at an encoder derived from source symbols, wherein a degree of an output symbol is the number of source symbols associated with that output symbol, wherein a degree of a check symbol is the number of source symbols associated with that check symbol, the computer program product comprising:

a processor-readable medium storing processor-readable instructions configured to cause a processor to:
(i) receive a first set of multi-stage output symbols wherein at least one of the multi-stage output symbols in the first set of multi-stage output symbols comprises a check symbol and at least one of the multi-stage output symbols in the first set of output symbols comprises an output symbol;
(ii) recover source symbols from the output symbols contained in the first set of multistage output symbols;
(iii) deactivate one or more unrecovered source symbols associated with an output symbol of degree two or higher thereby reducing the degree of any output symbol associated with a deactivated source symbol by one;
(iv) repeat steps (ii) and (iii) until all of the output symbols in the first set of output symbols have been used;
(v) decode the source symbols that have been deactivated; and
(vi) recover check symbols from the check symbols in the first set of multi-stage output symbols.

30. The product of claim 29, wherein the instructions are further configured to cause the processor to:
(vii) determine if all of the source symbols have been recovered;
(viii) request a second set of multi-stage output symbols if it is determined that not all of the source symbols have been recovered;
(ix) receive a second set of multi-stage output symbols; and
(x) repeat steps (ii)-(ix) on the second set of multi-stage output symbols until all of the source symbols have been recovered.

31. The product of claim 30, wherein the instructions are further configured to cause the processor to (xi) repeat steps (ii)-(ix) on the second set of multi-stage output symbols until all of the check symbols have been recovered.

32. The product of claim 29, wherein the instructions are further configured to cause the processor to:
(vii) receive a second set of multi-stage output symbols; and
(viii) merge the second set of multi-stage output symbols into the first set of multi-stage output symbols.

33. The product of claim 32, wherein steps (vii) and (viii) occur substantially concurrently with steps (ii)-(vi).

34. The product of claim 33, wherein steps (ii)-(viii) repeat until all of the source symbols have been recovered.

35. The product of claim 34, wherein steps (ii)-(viii) repeat until all of the check symbols have been recovered.

36. The product of claim 33, wherein step (vi) can be interrupted in favor of step (ii) if new output symbols containing source symbols are received.

* * * * *